(12) United States Patent
Asada et al.

(10) Patent No.: US 8,508,517 B2
(45) Date of Patent: Aug. 13, 2013

(54) ELECTROSTATIC PROTECTION ELEMENT

(75) Inventors: Tetsuo Asada, Osaka (JP); Hirofumi Nakagawa, Osaka (JP)

(73) Assignee: Panasonic Corporation, Osaka (JP)

( * ) Notice: Subject to any disclaimer, the term of this patent is extended or adjusted under 35 U.S.C. 154(b) by 238 days.

(21) Appl. No.: 13/144,631

(22) PCT Filed: Nov. 1, 2010

(86) PCT No.: PCT/JP2010/006429
§ 371 (c)(1),
(2), (4) Date: Jul. 14, 2011

(87) PCT Pub. No.: WO2011/096031
PCT Pub. Date: Aug. 11, 2011

(65) Prior Publication Data
US 2012/0105389 A1    May 3, 2012

(30) Foreign Application Priority Data
Feb. 4, 2010   (JP) ................................. 2010-022964

(51) Int. Cl.
*H01L 29/74* (2006.01)
*G06F 3/038* (2013.01)

(52) U.S. Cl.
USPC .......................................... 345/204; 257/173

(58) Field of Classification Search
USPC ................... 345/204; 257/173, 257; 361/56, 361/118
See application file for complete search history.

(56) References Cited

U.S. PATENT DOCUMENTS

| | | | |
|---|---|---|---|
| 6,538,266 B2 | 3/2003 | Lee et al. | |
| 7,106,562 B2 | 9/2006 | Kitagawa | |
| 2002/0017654 A1* | 2/2002 | Lee et al. | 257/173 |
| 2003/0214773 A1* | 11/2003 | Kitagawa | 361/118 |
| 2009/0244797 A1* | 10/2009 | Sawahata | 361/56 |

FOREIGN PATENT DOCUMENTS

| | | |
|---|---|---|
| JP | 2001-291836 | 10/2001 |
| JP | 2002-118178 | 4/2002 |
| JP | 2002-261238 | 9/2002 |
| JP | 2003-318265 | 11/2003 |
| JP | 2009-239050 | 10/2009 |
| JP | 2009-266845 | 11/2009 |

* cited by examiner

*Primary Examiner* — Joseph Feild
*Assistant Examiner* — Andrew Sasinowski
(74) *Attorney, Agent, or Firm* — McDermott Will & Emery LLP

(57) ABSTRACT

A electrostatic protection element (101) includes: a substrate (1) of a first conductivity type; a first low-concentration diffusion region (2) of a second conductivity type and a second low-concentration diffusion region (3) of the first conductivity type which are formed on said substrate (1), the second conductivity type being different from the first conductivity type; a first high-concentration diffusion region (4) of the second conductivity type and a second high-concentration diffusion region (5) of the first conductivity type which are (i) formed in said first low-concentration diffusion region (2), and (ii) electrically connected with each other; a third high-concentration diffusion region (9) of the first conductivity type and a fourth high-concentration diffusion region (8) of the second conductivity type which are (i) formed in said second low-concentration diffusion region (3), and (ii) electrically connected with each other; a fifth high-concentration diffusion region (6) of the first conductivity type formed in said first low-concentration diffusion region (2); and a sixth high-concentration diffusion region (7) of the second conductivity type formed in said second low-concentration diffusion region (3). The fifth high-concentration diffusion region (6) and the sixth high-concentration diffusion region (7) are electrically connected with each other.

10 Claims, 23 Drawing Sheets

ELECTROSTATIC PROTECTION ELEMENT

RELATED APPLICATIONS

This application is the U.S. National Phase under 35 U.S.C. §371 of International Application No. PCT/JP2010/006429, filed on Nov. 1, 2010, which in turn claims the benefit of Japanese Application No. 2010-022964, filed on Feb. 4, 2010, the disclosures of which Applications are incorporated by reference herein.

TECHNICAL FIELD

The present invention relates to electrostatic protection elements which prevent a semiconductor integrated circuit from being destructed due to (i) external electrostatic discharge and noise input coming into the semiconductor integrated circuit itself, and (ii) the electrostatically-charged semiconductor integrated circuit discharging the static electricity out of the semiconductor integrated circuit itself.

BACKGROUND ART

Electrostatic protection elements are used in semiconductor integrated circuits in order to keep electrostatic discharge (ESD) and electrical overstress (EOS), applied to an input terminal and an output terminal, from exceeding breakdown voltage ($V_{DES}$) inside the semiconductor integrated circuit.

Mainly used as the electrostatic protection elements are diodes, thyristors, metal-oxide-semiconductor (MOS) transistors, and bipolar transistors.

Having a structure exemplified in FIG. 25, a typical thyristor shows an excellent current driving capability per unit area. Thus, when used for an electrostatic protection element, the thyristor can fit on a small area within the semiconductor integrated circuit. As typical V-I characteristics in FIG. 26 show, however, the thyristor-equipped electrostatic protection element usually has a holding voltage (Vh) lower than a power-supply voltage (VDD) of the semiconductor integrated circuit. Hence, when noise enters the thyristor while the semiconductor integrated circuit is operating; that is when the power-supply voltage is applied to the semiconductor integrated circuit, the thyristor turns on, and a current keeps running between an anode and a cathode. This leads to latchup.

There are two main causes to develop the latchup. The first cause is due to substrate noise (substrate current). The second cause is due to electrical overstress. Both of the causes arise when the latchup continues in the case where the holding voltage (Vh) is lower than the power-supply voltage. In general, the first latchup caused by the substrate noise is defined as withstand current in the current-mode latchup test. The second latchup caused by the electrical overstress is defined as withstand voltage in the supply electrical overstress test.

Once the latchup occurs in the electrostatic protection element, the current will keep running in the electrostatic protection element unless the power supply of the semiconductor integrated circuit is shut down. The overcurrent develops Joule heat, leading to destruction of junction and melted wiring and causing destruction of the electrostatic protection element and the semiconductor integrated circuit.

Thus, for example, Patent Literature 1 discloses a technique to adjust, to increase, the holding voltage of the electrostatic protection element equal to or greater than the power-supply voltage.

FIG. 27 shows a structure of an electrostatic protection element disclosed in Patent Literature 1. An npn transistor forms a thyristor used for an electrostatic protection element 900 of a semiconductor integrated circuit. The npn transistor has (i) a collector region formed of an n-type anode-gate high-concentration impurity region 912, and an n-type well layer 908, (ii) a base region formed of a p-type cathode-gate high-concentration impurity region 918, a p-type well layer 902, and a p-type substrate 901, and (iii) an emitter region formed of an n-type cathode high-concentration impurity region 906. The npn transistor has distance "A" set shorter than usual across a first element isolation insulator 903a. The first element isolation insulator 903a is provided between (i) the p-type cathode-gate high-concentration impurity region 918 included in the base region of the npn transistor and (ii) the n-type cathode high-concentration impurity region 906 included in the emitter region of the npn transistor.

Accordingly, the base-emitter resistance value of the npn transistor decreases, resulting in a successful increase in the voltage for driving the npn transistor as well as in the holding voltage of the electrostatic protection element. This structure makes possible introducing an electrostatic protection element for a semiconductor integrated circuit, freeing the semiconductor integrated circuit from the latchup which leaves a thyristor, forming the electrostatic protection element, on due to an external noise signal.

Hence, in order to prevent the latchup, the thyristor-equipped electrostatic protection element requires (Request 1) operating characteristics showing that the holding voltage (Vh) of the thyristor is higher than the power-supply voltage (VDD).

The electrostatic protection element using the thyristor also requires some other operating characteristics.

In order to achieve the intended purpose of protecting the semiconductor integrated circuit, a trigger voltage ($V_{TRIG}$); that is a voltage to trigger the operation of the thyristor, shall be equal to or lower than the breakdown voltage ($V_{DES}$) inside the semiconductor integrated circuit to be protected (Request 2).

FIG. 28 shows an action region constrained by the Requests 1 and 2 in the V-I characteristic graph of the thyristor-equipped electrostatic protection element. The thyristor-equipped electrostatic protection element operates in the whiteout region in FIG. 28 to safely and surely protect the semiconductor integrated circuit to be protected. Such a restricted action region is typically known as a design window for the thyristor-equipped electrostatic protection element.

CITATION LIST

Patent Literature
[PTL 1]
  Japanese Patent Application Publication No. 2002-261238

SUMMARY OF INVENTION

Technical Problem

To meet the Request 1, Patent Literature 1 involves adjusting the width of the element isolation insulator, forming the thyristor, of the electrostatic protection element, so that the holding voltage of the thyristor is adjusted to increase to be equal to or higher than the power-supply voltage for the semiconductor integrated circuit. This causes a problem in that the size of the thyristor-equipped electrostatic protection element inevitably depends on the power-supply voltage and the process condition of the semiconductor integrated circuit.

Moreover, Patent Literature 1 completely fails to describe any specific technique to meet the Request 2. The structure of the thyristor is not obvious enough to fulfill the Request 2.

The present invention is conceived in view of the above problems and has an object to present a thyristor-equipped electrostatic protection element which has a suitable structure for (i) adjusting a holding voltage to increase as high as or higher than a power-supply voltage (advanced fulfillment of the Request 1), and (ii) adjusting a trigger voltage of the thyristor to decrease as low as or lower than a voltage which destructs the inside of the semiconductor integrated circuit.

Solutions to Problems

An electrostatic protection element according to an aspect of the present invention includes: a substrate of a first conductivity type; a first low-concentration diffusion region of a second conductivity type and a second low-concentration diffusion region of the first conductivity type which are formed on the substrate, the second conductivity type being different from the first conductivity type; a first high-concentration diffusion region of the second conductivity type and a second high-concentration diffusion region of the first conductivity type which are (i) formed in the first low-concentration diffusion region, and (ii) electrically connected with each other; a third high-concentration diffusion region of the first conductivity type and a fourth high-concentration diffusion region of the second conductivity type which are (i) formed in the second low-concentration diffusion region, and (ii) electrically connected with each other; a fifth high-concentration diffusion region of the first conductivity type formed in the first low-concentration diffusion region; and a sixth high-concentration diffusion region of the second conductivity type formed in the second low-concentration diffusion region.

Here, the electrostatic protection element may have the fifth high-concentration diffusion region and the sixth high-concentration diffusion region electrically connected with each other, and may include an external terminal which is electrically connected to the fifth high-concentration diffusion region; and an external terminal which is electrically connected to the sixth high-concentration diffusion region.

The above structure successfully obtains the effect of adjusting the holding voltage of a thyristor equal to or higher than a power-supply voltage in order to prevent the latchup.

Furthermore, the electrostatic protection element may include: a seventh high-concentration diffusion region which (i) is formed in one of the first low-concentration diffusion region and the second low-concentration diffusion region, and (ii) has a conductivity type different from the conductivity type of one of the first low-concentration diffusion region and the second low-concentration diffusion region in which the seventh high-concentration diffusion region is formed, wherein the seventh high-concentration diffusion region may be electrically connected with one of the second high-concentration diffusion region and the fourth high-concentration diffusion region whichever having the conductivity type different from the conductivity type of the seventh high-concentration diffusion region.

The above structure successfully obtains the effects of (i) adjusting the holding voltage of the thyristor equal to or higher than the power-supply voltage in order to prevent the latch up and (ii) making the trigger voltage; namely the operation trigger voltage of the thyristor, equal to or lower than a voltage which destructs the inside of the semiconductor integrated circuit.

In the electrostatic protection element, the first conductivity type may be a p-type, and the second conductivity type may be an n-type, the first high-concentration diffusion region and the second high-concentration diffusion region may be connected to a high potential, and the third high-concentration diffusion region and the fourth high-concentration diffusion region may be connected to a low potential. The first conductivity type may be an n-type, and the second conductivity type is a p-type, the first high-concentration diffusion region and the second high-concentration diffusion region may be connected to a low potential, and the third high-concentration diffusion region and the fourth high-concentration diffusion region may be connected to a high potential.

The electrostatic protection element may include an external terminal which is electrically connected to a connection point between the fifth high-concentration diffusion region and the sixth high-concentration diffusion region.

The above structure successfully obtains the effects of (i) controlling the holding voltage of the thyristor from outside, and (ii) making the trigger voltage; namely the operation trigger voltage of the thyristor, equal to or lower than a voltage which destructs the inside of the semiconductor integrated circuit.

In the electrostatic protection element, the fifth high-concentration diffusion region and the sixth high-concentration diffusion region are electrically connected with each other via a resistive element.

The above structure successfully obtains the effects of (i) controlling the holding voltage of the thyristor by a resistor, and (ii) making the trigger voltage; namely the operation trigger voltage of the thyristor, equal to or lower than a voltage which destructs the inside of the semiconductor integrated circuit.

A display apparatus according to another aspect of the present invention includes: a control circuit which controls a signal line and a scanning line based on one or more signals provided from outside; a signal line driving circuit; a scanning line driving circuit; and the one or more electrostatic protection elements described above. The fifth high-concentration diffusion region and the sixth high-concentration diffusion region in the one or more electrostatic protection elements are electrically connected with each other. Furthermore, in the display apparatus, the one or more electrostatic protection elements are implemented in one or more of the control circuit, the signal line driving unit, and the scanning line driving circuit.

This structure successfully obtains the effect of preventing electrostatic discharge (ESD) and electrical overstress (EDS) developed in the display apparatus from destructing the semiconductor integrated circuit.

A display apparatus according to another aspect of the present invention includes: a control circuit which controls a signal line and a scanning line based on one or more signals provided from outside; a signal line driving circuit; a scanning line driving circuit; and the one or more electrostatic protection elements described above, wherein the one or more electrostatic protection elements are implemented in one or more of the control circuit, the signal line driving unit, and the scanning unit, and the two external terminals of the electrostatic protection element are connected with each other via one or more resistive elements provided to the display apparatus.

The above structure successfully obtains the effects of (i) controlling, in the display apparatus, the holding voltage of the thyristor by a resistor implemented in the display apparatus, and (ii) making the trigger voltage; namely the operation trigger voltage of the thyristor, equal to or lower than a voltage which destructs the inside of the semiconductor integrated circuit.

Advantageous Effects of Invention

An electrostatic protection element according to an implementation of the present invention includes: a substrate of a first conductivity type; a first low-concentration diffusion region of a second conductivity type and a second low-concentration diffusion region of the first conductivity type which are formed on the substrate, the second conductivity type being different from the first conductivity type; a first high-concentration diffusion region of the second conductivity type and a second high-concentration diffusion region of the first conductivity type which are (i) formed in the first low-concentration diffusion region, and (ii) electrically connected with each other; a third high-concentration diffusion region of the first conductivity type and a fourth high-concentration diffusion region of the second conductivity type which are (i) formed in the second low-concentration diffusion region, and (ii) electrically connected with each other; a fifth high-concentration diffusion region of the first conductivity type formed in the first low-concentration diffusion region; a sixth high-concentration diffusion region of the second conductivity type formed in the second low-concentration diffusion region; a seventh high-concentration diffusion region which is (i) formed in one of the first low-concentration diffusion region and the second low-concentration diffusion region, and (ii) has a conductivity type different from the conductivity type of one of the first low-concentration diffusion region and the second low-concentration diffusion region in which the seventh high-concentration diffusion region is formed, wherein the seventh high-concentration diffusion region is electrically connected with one of the second high-concentration diffusion region and the fourth high-concentration diffusion region whichever having a conductivity type different from the conductivity type of the seventh high-concentration diffusion region.

The above structure successfully obtains the effect of adjusting a holding voltage (Vh) of the thyristor higher than a power-supply voltage in order to prevent the latchup. The above structure also successfully obtains the effect of making a trigger voltage ($V_{TRG}$); namely the operation trigger voltage of the thyristor, lower than a voltage which destructs the inside of the semiconductor integrated circuit.

DESCRIPTION OF EMBODIMENTS

Hereinafter, Embodiments of the present invention shall be described with reference to the drawings.

It is noted that the constituent features sharing the same reference signs operate in a similar manner, thus the description thereof would not be repeated.

[Embodiment 1]

Figure 1:
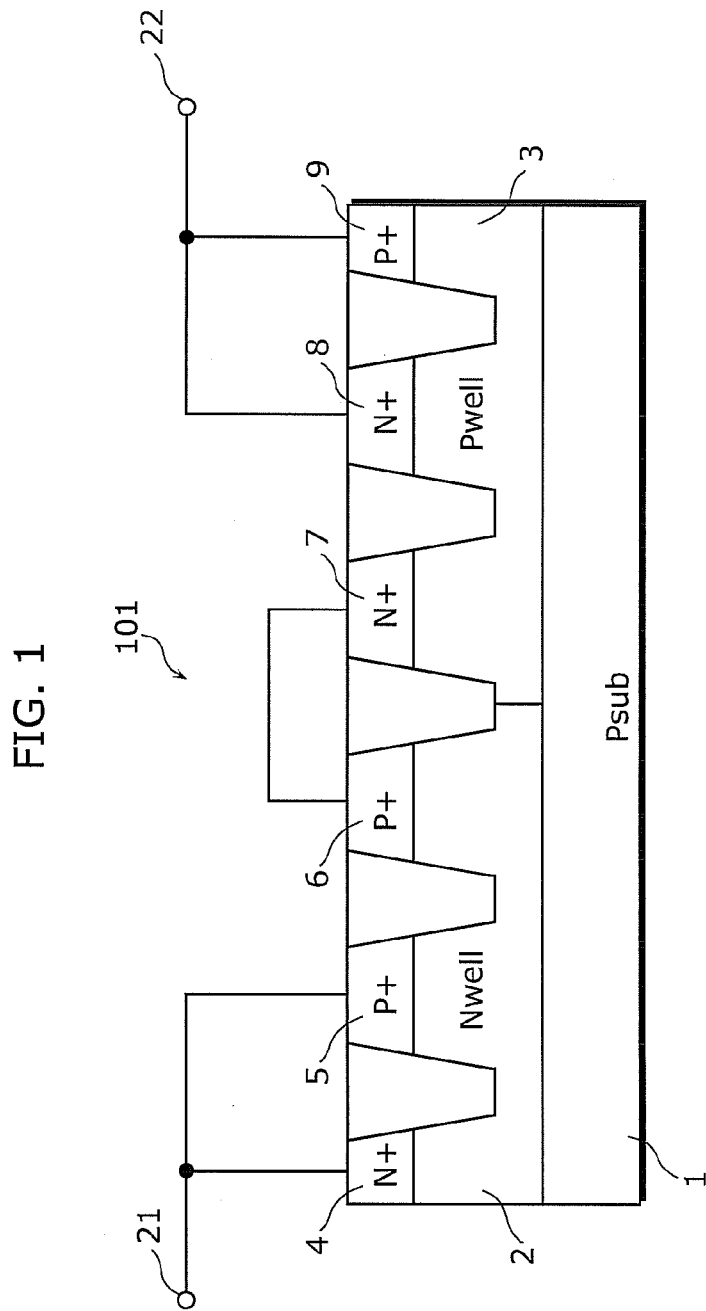
FIG. 1 is a structural diagram of an electrostatic protection element according to Embodiment 1 of the present invention.

FIG. 1 a structural diagram of an electrostatic protection element 101 equipped with a thyristor according to Embodiment 1 of the present invention.

Figure 2:
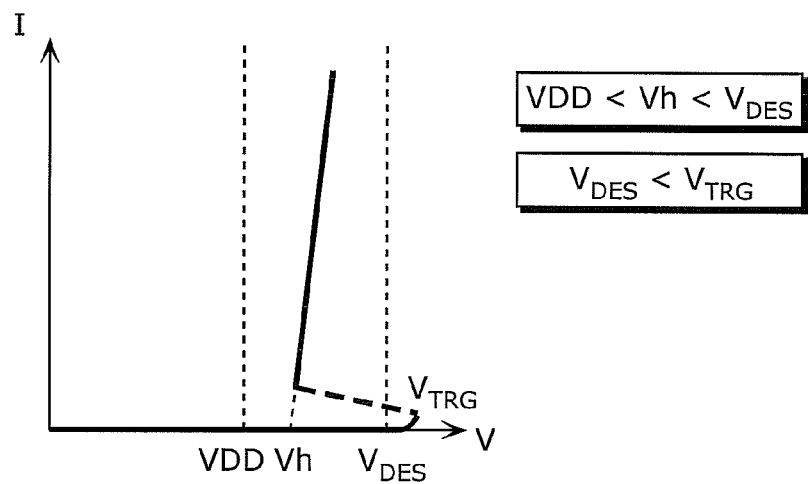
FIG. 2 is a V-I characteristic graph in Embodiments 1 and 6 of the present invention.

FIG. 2 is a V-I characteristic graph of the electrostatic protection element 101 according to Embodiment 1.

Figure 3:
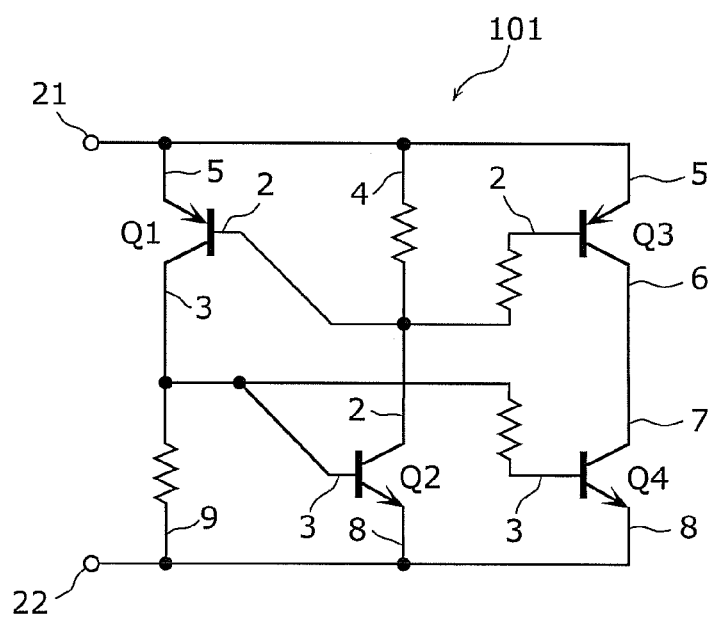
FIG. 3 is an equivalent circuit diagram of the electrostatic protection element according to Embodiment 1 of the present invention.

FIG. 3 is an equivalent circuit diagram of the electrostatic protection element 101 according to Embodiment 1.

It is noted that FIG. 3 shows a part of a parasitic element found in the structure in FIG. 1, as well as a PNP bipolar transistor Q1 and an NPN bipolar transistor Q2 forming the thyristor. For example, a PNP bipolar transistor Q3 and an NPN bipolar transistor Q4 in FIG. 3 are a part of the parasitic element added to the structure shown in FIG. 1.

The parts sharing the same reference signs between FIGS. 1 and 3 correspond with each other. Such parts work as the base, the collector, and the emitter of each bipolar transistor.

In FIG. 1, the electrostatic protection element 101 includes: a substrate 1 of a first conductivity type; a first low-concentration diffusion region 2 of a second conductivity type and a second low-concentration diffusion region 3 of the first conductivity type which are formed on the substrate 1, the second conductivity type being different from the first conductivity type; a first high-concentration diffusion region 4 of the second conductivity type and a second high-concentration diffusion region 5 of the first conductivity type which are (i) formed in the first low-concentration diffusion region 2 and (ii) electrically connected with each other; a third high-concentration diffusion region 9 of the first conductivity type and a fourth high-concentration diffusion region 8 of the second conductivity type which are (i) formed in the second low-concentration region 3 and (ii) electrically connected with each other; a fifth high-concentration diffusion region 6 of the first conductivity type formed in the first low-concentration diffusion region 2; and a sixth high-concentration diffusion region 7 of the second conductivity type formed in the second low-concentration diffusion region 3. The fifth high-concentration diffusion region 6 and the sixth high-concentration diffusion region 7 are electrically connected with each other in the electrostatic protection element 101.

In FIG. 1, for example, the first conductivity type may be the p-type, and the second conductivity type may be the n-type. The substrate 1 of the first conductivity type corresponds to Psub. The first low-concentration diffusion region 2 of the second conductivity type corresponds to Nwell. The second low-concentration diffusion region 3 of the first conductivity type corresponds to Pwell. External terminals 21 and 22 of the electrostatic protection element 101 are respectively connected to a high potential (a power-supply voltage VDD, for example) and to a low potential (a ground potential GND, for example).

It is noted that, in the Description, the high-concentration diffusion region and the low-concentration diffusion region are formed in a typical semiconductor process, and have impurities diffused at a different concentration. High and low refer to relative differences between an impurity concentration in the high-concentration diffusion region and an impurity concentration in the low-concentration diffusion region.

Described hereinafter are operations of the electrostatic protection element 101 structured above according to Embodiment 1.

Figure 25:
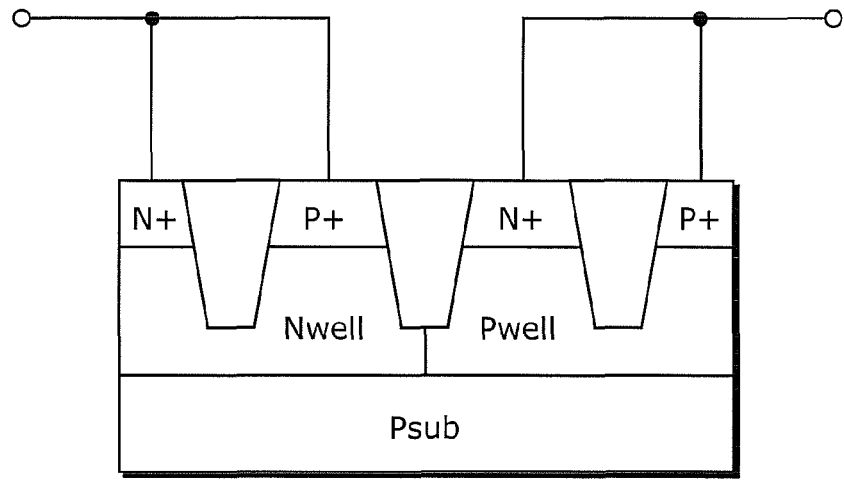
FIG. 25 is a structural diagram of a typical thyristor.
Figure 26:
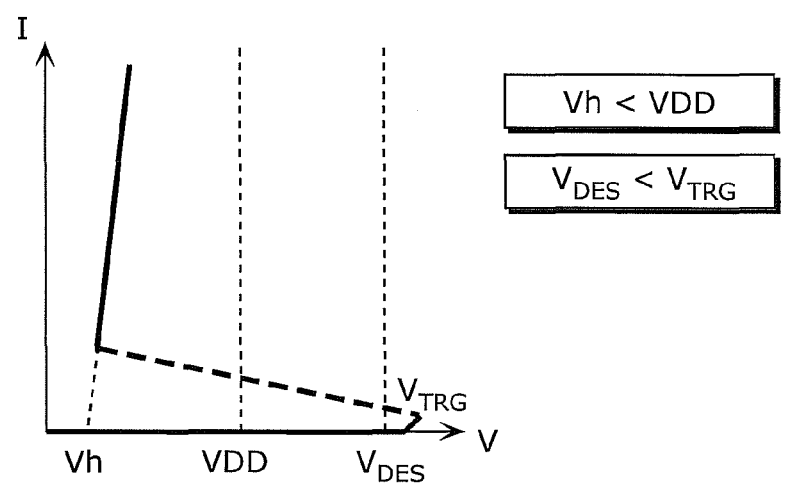
FIG. 26 is a V-I characteristic graph of the typical thyristor.
Figure 27:
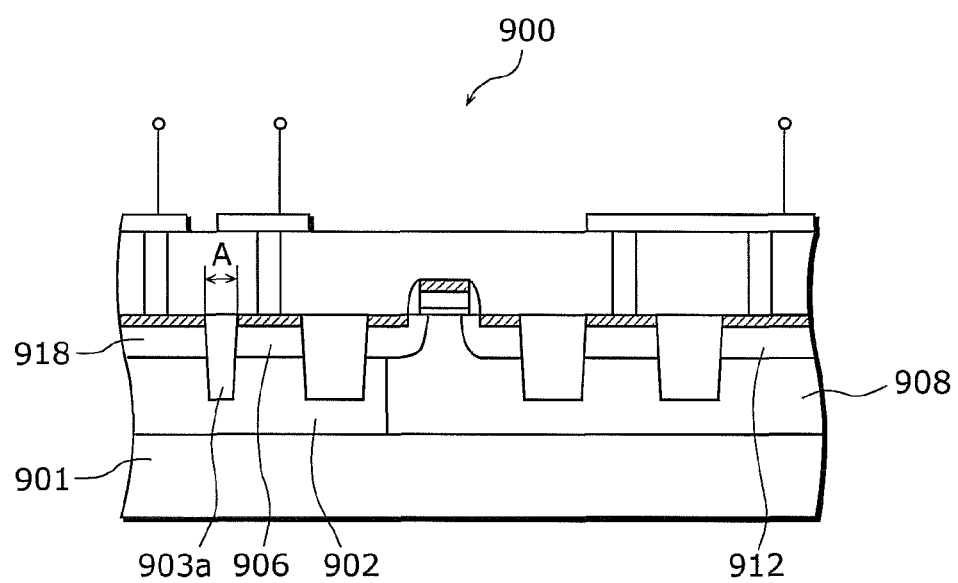
FIG. 27 is a structural diagram of a conventional electrostatic protection element.
Figure 28:
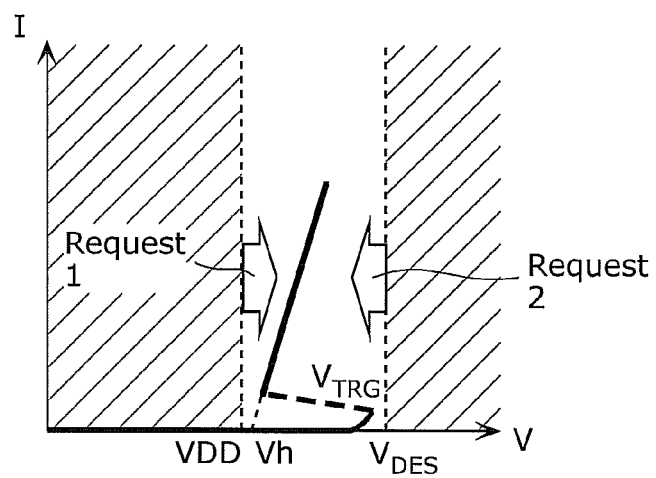
FIG. 28 shows a constrained action region of the electrostatic protection element using the thyristor.

The conventional thyristor is structured as shown in FIG. 25, and presents the V-I characteristics as shown in FIG. 26.

Here, VDD refers to a power-supply voltage of the semiconductor integrated circuit, Vh refers to a holding voltage of the thyristor, $V_{TRG}$ refers to an operation trigger voltage of the thyristor, and $V_{DES}$ refers to a voltage to destruct the inside of the semiconductor integrated circuit.

As shown in FIG. 26, the thyristor with its structure shown in FIG. 25 has (i) the holding voltage Vh lower than the power-supply voltage VDD, and (ii) the operation trigger voltage $V_{TRG}$ thereof higher than the voltage $V_{DES}$ which destructs the inside of the semiconductor integrated circuit.

Thus the use of the thyristor as an electrostatic protection element causes either (i) the destruction of the inside of the semiconductor integrated circuit by electrical overstress or (ii) the latchup in the thyristor itself; namely the electrostatic protection element, followed by the overcurrent developing Joule heat, and leading to destruction of junction and melted wiring.

As shown in FIG. 3, however, the electrostatic protection element 101 of Embodiment 1 in FIG. 1 receives electrical charges at Q3 and Q4, so that a potential difference develops between the low-concentration diffusion region 2 of the second conductivity type and the low-concentration diffusion region 3 of the first conductivity type. Thus, even though the voltage between the external terminals 21 and 22 is high, Q1 and Q2 can turn off. Hence, as seen in FIG. 2, the V-I characteristics show that the holding voltage Vh is higher than the power-supply voltage VDD. Accordingly, the latchup is successfully prevented.

As described above, Embodiment 1 shows that a typical thyristor structure additionally has the fifth high-concentration diffusion region 6 and the sixth high-concentration diffusion region 7 which are electrically connected with each other. This structure successfully prevents the latchup.

[Embodiment 2]

Figure 4:
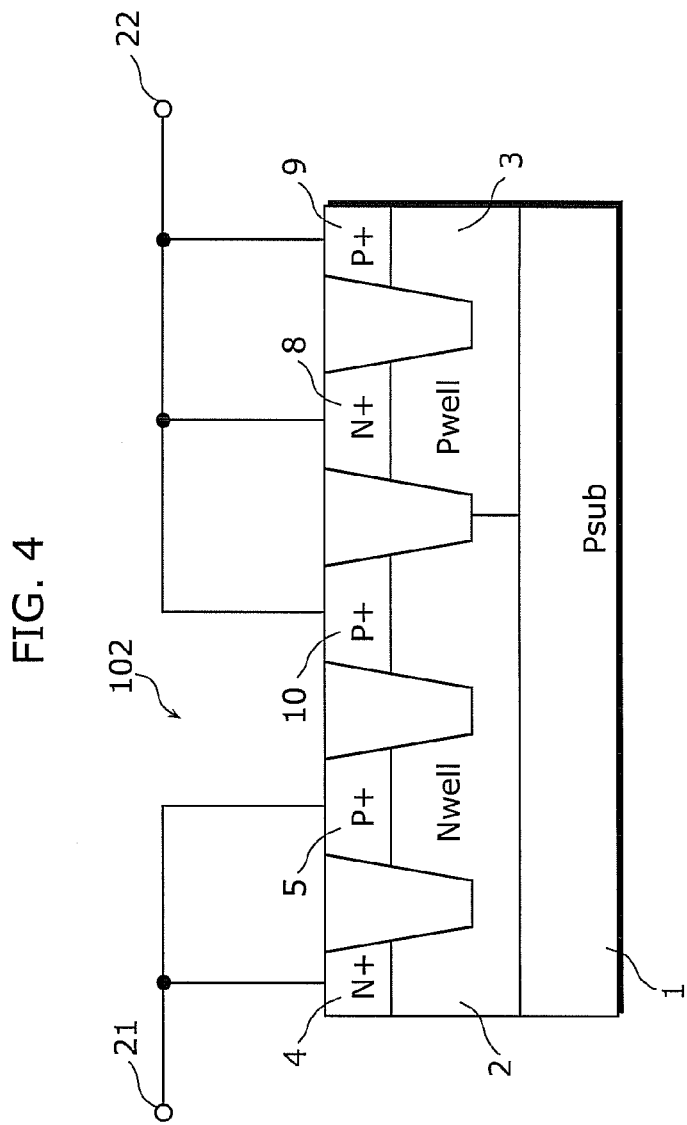
FIG. 4 is a structural diagram of an electrostatic protection element according to Embodiment 2 of the present invention.

FIG. 4 is a structural diagram of an electrostatic protection element 102 equipped with a thyristor according to Embodiment 2 of the present invention.

Figure 5:
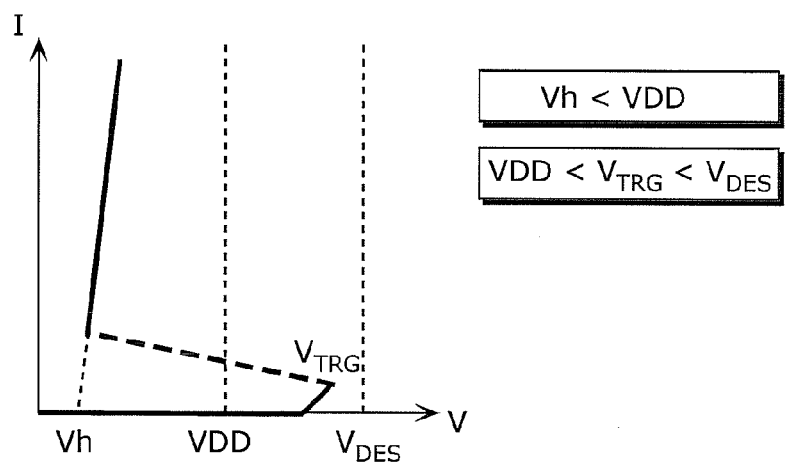
FIG. 5 is a V-I characteristic graph in Embodiments 2 and 3 of the present invention.

FIG. 5 is a V-I characteristic graph of the electrostatic protection element 102 according to Embodiment 2.

Figure 6:
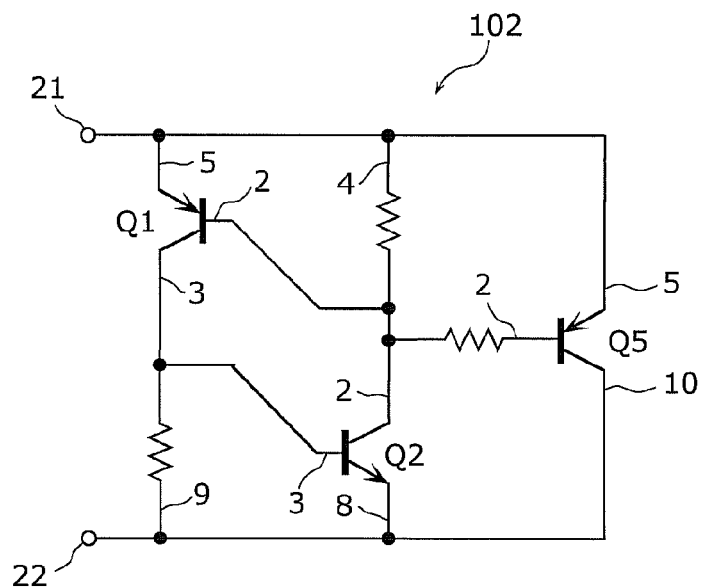
FIG. 6 is an equivalent circuit diagram of the electrostatic protection element according to Embodiment 2 of the present invention.

FIG. 6 is an equivalent circuit diagram of the electrostatic protection element 102 according to Embodiment 2.

It is noted that FIG. 6 shows a part of a parasitic element found in the structure in FIG. 4, as well as the PNP bipolar transistor Q1 and the NPN bipolar transistor Q2 forming the thyristor. For example, a PNP bipolar transistor Q5 is a part of the parasitic element added to the structure shown in FIG. 4.

The parts sharing the same reference signs between FIGS. 4 and 6 correspond with each other. Such parts work as the base, the collector, and the emitter of each bipolar transistor.

In FIG. 4, the electrostatic protection element 102 includes: the substrate 1 of the first conductivity type; the first low-concentration diffusion region 2 of the second conductivity type and the second low-concentration diffusion region 3 of the first conductivity type which are formed on the substrate 1, the second conductivity type being different from the first conductivity type; the first high-concentration diffusion region 4 of the second conductivity type and the second high-concentration diffusion region 5 of the first conductivity type which are (i) formed in the first low-concentration diffusion region 2 and (ii) electrically connected with each other; the third high-concentration diffusion region 9 of the first conductivity type and the fourth high-concentration diffusion region 8 of the second conductivity type which are (i) formed in the second low-concentration region 3 and (ii) electrically connected with each other; and the seventh high-concentration diffusion region 10 of the first conductivity type formed in the first low-concentration diffusion region 2. The seventh high-concentration diffusion region 10, the third high-concentration diffusion region 9, and the fourth high-concentration diffusion region 8 are electrically connected with each other.

Here, for example, the first conductivity type may be the p-type, and the second conductivity type may be the n-type. The substrate 1 of the first conductivity type corresponds to Psub. The first low-concentration diffusion region 2 of the second conductivity type corresponds to Nwell. The second low-concentration diffusion region 3 of the first conductivity type corresponds to Pwell.

The external terminals 21 and 22 of the electrostatic protection element 102 are respectively connected to a high potential (VDD, for example) and to a low potential (GND, for example).

Described hereinafter are operations of the electrostatic protection element 102 structured above according to Embodiment 2.

As shown in FIG. 26, the thyristor with its structure shown in FIG. 25 has (i) the holding voltage Vh lower than the power-supply voltage VDD, and (ii) the operation trigger voltage $V_{TRG}$ of thereof higher than the voltage $V_{DES}$ which destructs the inside of the semiconductor integrated circuit. Thus the use of the thyristor as an electrostatic protection element causes either (i) the destruction of the inside of the semiconductor integrated circuit by electrical overstress or (ii) the latchup in the thyristor itself; namely the electrostatic protection element, followed by the overcurrent developing Joule heat, and leading to destruction of junction and melted wiring.

However, the electrostatic protection element 102 in FIG. 4 according to Embodiment 2 has, as seen in FIG. 5, the V-I characteristics showing that the operation trigger voltage $V_{TRG}$ of the thyristor is lower than the voltage $V_{DES}$ which destructs the inside of the semiconductor integrated circuit. This successfully prevents the electrical overstress from destructing the inside of the semiconductor integrated circuit.

As described above, Embodiment 2 shows that a typical thyristor structure additionally has the seventh high-concentration diffusion region 10, and the seventh high-concentration diffusion region 10, the third high-concentration diffusion region 9, and the fourth high-concentration diffusion region 8 are electrically connected with each other. This structure successfully prevents electrical overstress from destructing the inside of the semiconductor integrated circuit.

[Embodiment 3]

Figure 7:
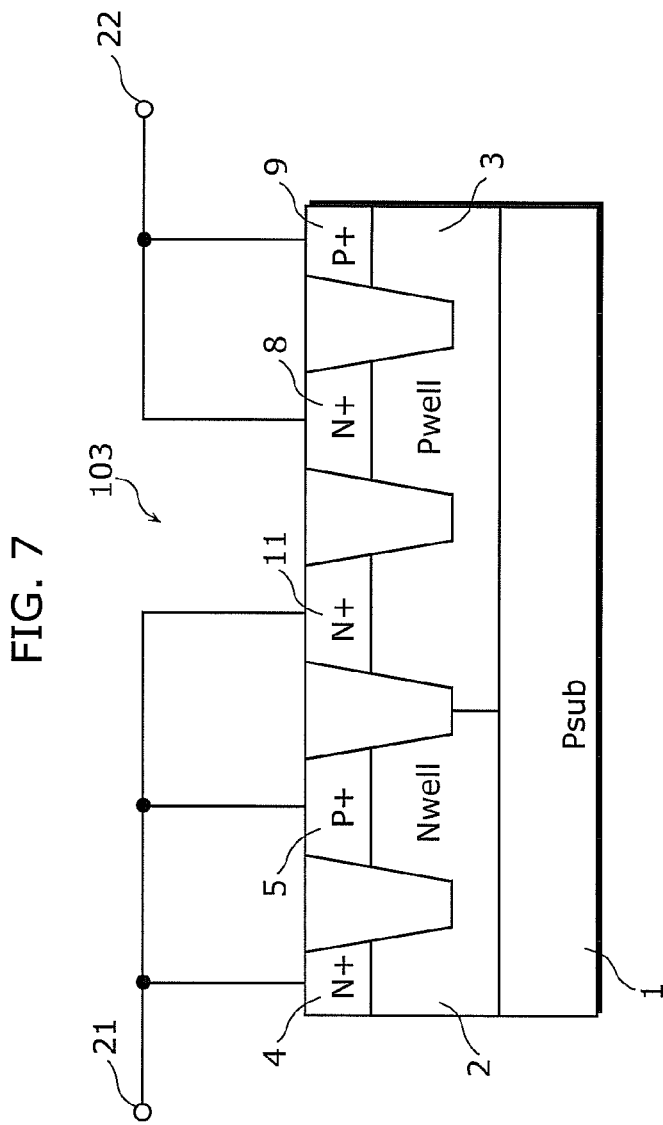
FIG. 7 is a structural diagram of an electrostatic protection element according to Embodiment 3 of the present invention.

FIG. 7 is a structural diagram of an electrostatic protection element equipped with a thyristor according to Embodiment 3 of the present invention.

The V-I characteristic graph of an electrostatic protection element 103 according to Embodiment 3 is the same as that of the electrostatic protection element 102 shown in FIG. 5.

Figure 8:
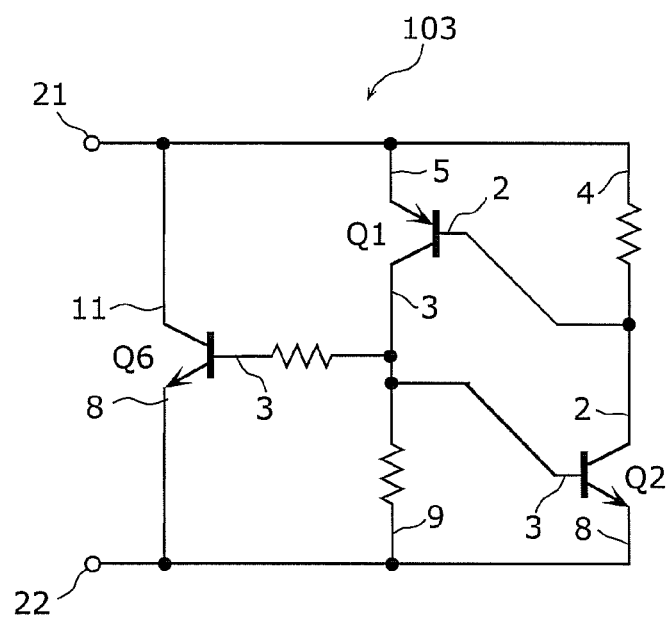
FIG. 8 is an equivalent circuit diagram of the electrostatic protection element according to Embodiment 3 of the present invention.

FIG. 8 is an equivalent circuit diagram of the electrostatic protection element 103 according to Embodiment 3.

It is noted that FIG. 8 shows a part of a parasitic element found in the structure in FIG. 7, as well as the PNP bipolar transistor Q1 and the NPN bipolar transistor Q2 forming the thyristor. For example, an NPN bipolar transistor Q6 in FIG. 8 is a part of the parasitic element added to the structure shown in FIG. 7.

The parts sharing the same reference signs between FIGS. 7 and 8 correspond with each other. Such parts work as the base, the collector, and the emitter of each bipolar transistor.

In FIG. 7, the electrostatic protection element 103 includes: the substrate 1 of the first conductivity type; the first low-concentration diffusion region 2 of the second conductivity type and the second low-concentration diffusion region 3 of the first conductivity type which are formed on the substrate 1, the second conductivity type being different from the first conductivity type; the first high-concentration diffusion region 4 of the second conductivity type and the second high-concentration diffusion region 5 of the first conductivity type which are (i) formed in the first low-concentration diffusion region 2 and (ii) electrically connected with each other; the third high-concentration diffusion region 9 of the first conductivity type and the fourth high-concentration diffusion region 8 of the second conductivity type which are (i) formed in the second low-concentration region 3 and (ii) electrically connected with each other; and a seventh high-concentration diffusion region 11 of the second conductivity type which is formed in the second low-concentration diffusion region 3. The seventh high-concentration diffusion region 11, the first high-concentration diffusion region 4, and the second high-concentration diffusion region 5 are connected with each other.

Here, for example, the first conductivity type may be the p-type, and the second conductivity type may be the n-type. The substrate 1 of the first conductivity type corresponds to Psub. The first low-concentration diffusion region 2 of the second conductivity type corresponds to Nwell. The second low-concentration diffusion region 3 of the first conductivity type corresponds to Pwell.

The external terminals 21 and 22 of the electrostatic protection element 103 are respectively connected to a high potential (VDD, for example) and to a low potential (GND, for example).

Described hereinafter are operations of the electrostatic protection element 103 structured above according to Embodiment 3.

As shown in FIG. 26, the thyristor with its structure shown in FIG. 25 has (i) the holding voltage Vh lower than the power-supply voltage VDD, and (ii) the operation trigger voltage $V_{TRG}$ thereof higher than the voltage $V_{DES}$ which destructs the inside of the semiconductor integrated circuit. Thus the use of the thyristor as an electrostatic protection element causes either (i) the destruction of the inside of the semiconductor integrated circuit by electrical overstress or (ii) the latchup in the thyristor itself; namely the electrostatic protection element, followed by the overcurrent developing Joule heat, and leading to destruction of junction and melted wiring.

However, the electrostatic protection element 103 in FIG. 7 according to Embodiment 3 has, as seen in FIG. 5, the V-I characteristics showing that the operation trigger voltage $V_{TRG}$ of the thyristor is lower than the voltage $V_{DES}$ which destructs the inside of the semiconductor integrated circuit. This successfully prevents the electrical overstress from destructing the inside of the semiconductor integrated circuit.

As described above, Embodiment 3 shows that a typical thyristor structure additionally has the seventh high-concentration diffusion region 11, and the seventh high-concentration diffusion region 11, the first high-concentration diffusion region 4, and the second high-concentration diffusion region 5 are electrically connected with each other. This structure successfully prevents electrical overstress from destructing the inside of the semiconductor integrated circuit.

[Embodiment 4]

Figure 9:
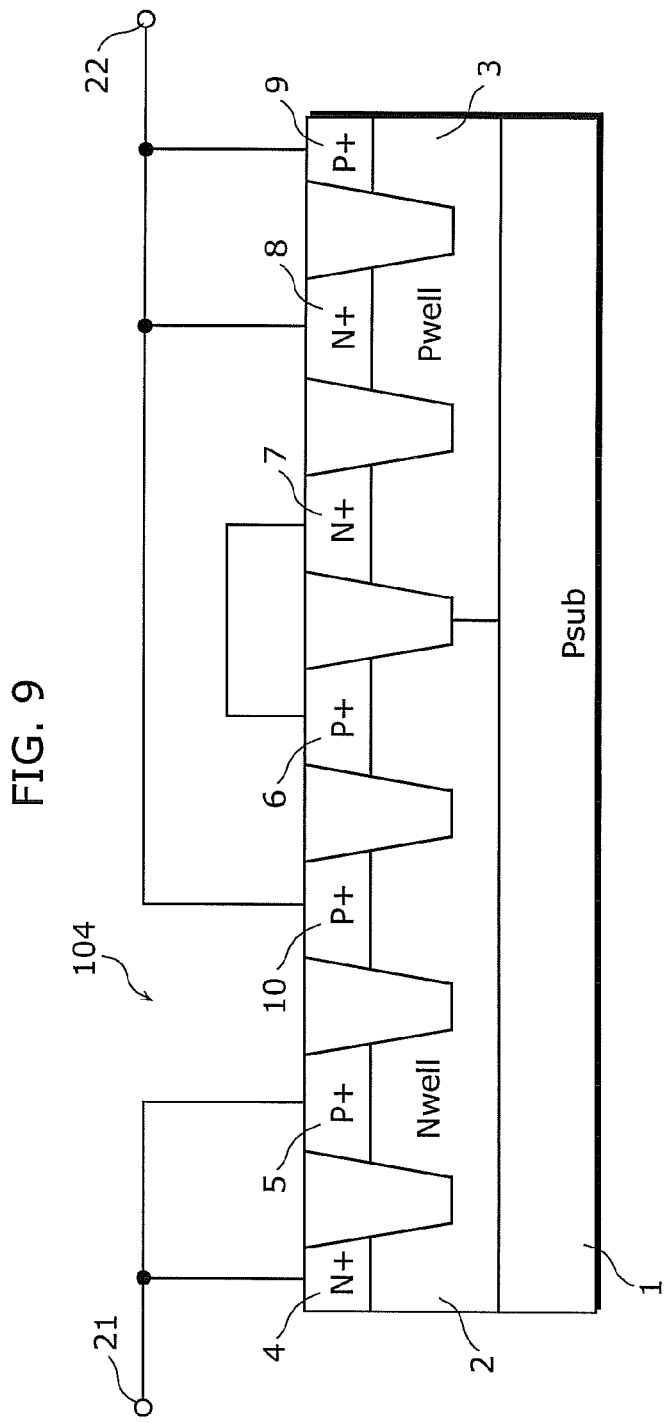
FIG. 9 is a structural diagram of an electrostatic protection element according to Embodiment 4 of the present invention.

FIG. 9 is a structural diagram of an electrostatic protection element equipped with a thyristor according to Embodiment 4 of the present invention.

Figure 10:
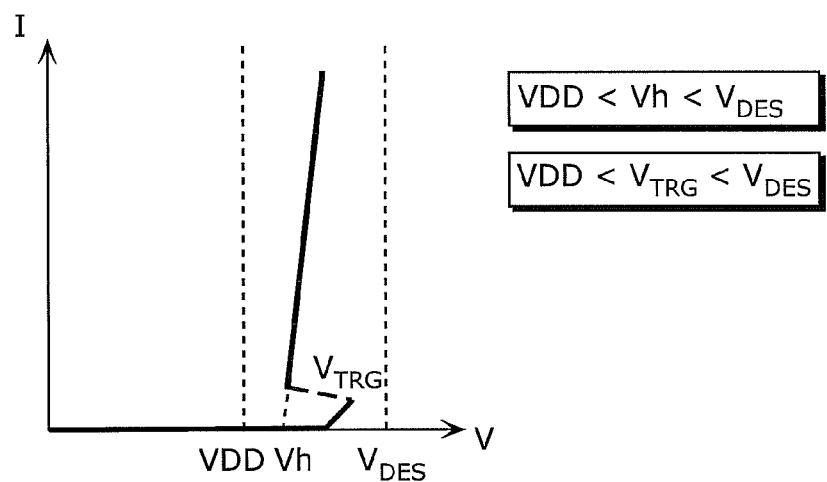
FIG. 10 is a V-I characteristic graph in Embodiments 4 and 5 of the present invention.

FIG. 10 is a V-I characteristic graph of an electrostatic protection element 104 according to Embodiment 4.

Figure 11:
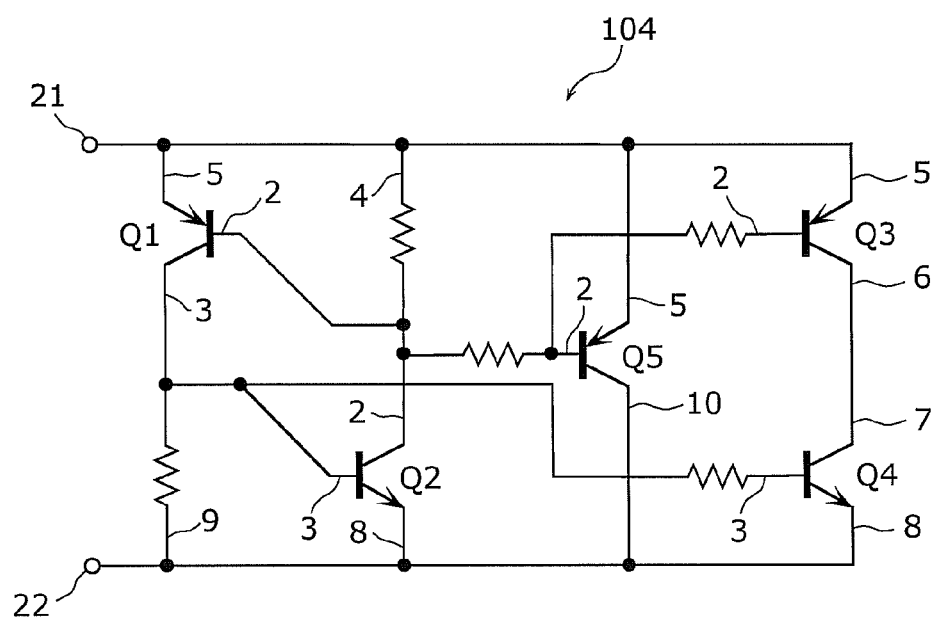
FIG. 11 is an equivalent circuit diagram of the electrostatic protection element according to Embodiment 4 of the present invention.

FIG. 11 is an equivalent circuit diagram of the electrostatic protection element 104 according to Embodiment 4.

It is noted that FIG. 11 shows a part of a parasitic element found in the structure in FIG. 9, as well as the PNP bipolar transistor Q1 and the NPN bipolar transistor Q2 forming the thyristor. For example, the PNP bipolar transistors Q3 and Q5, and the NPN bipolar transistor Q4 in FIG. 11 are a part of the parasitic element added to the structure shown in FIG. 9.

The parts sharing the same reference signs between FIGS. 9 and 11 correspond with each other. Such parts work as the base, the collector, and the emitter of each bipolar transistor.

As shown in FIG. 9, the electrostatic protection element 104 includes a seventh high-concentration diffusion region 10 of the first conductivity type formed in the first low-concentration diffusion region 2, in addition to all the constituent features of the electrostatic protection element 101 shown in FIG. 1. The seventh high-concentration diffusion region 10, the third high-concentration diffusion region 9, and the fourth high-concentration diffusion region 8 are electrically connected with each other.

Described hereinafter are operations of the electrostatic protection element 104 structured above according to Embodiment 4.

As shown in FIG. 26, the thyristor with its structure shown in FIG. 25 has (i) the holding voltage Vh lower than the power-supply voltage VDD, and (ii) the operation trigger voltage $V_{TRG}$ thereof higher than the voltage $V_{DES}$ which destructs the inside of the semiconductor integrated circuit. Thus the use of the thyristor as an electrostatic protection element causes either (i) the destruction of the inside of the semiconductor integrated circuit by electrical overstress or (ii) the latchup in the thyristor itself; namely the electrostatic protection element, followed by the overcurrent developing Joule heat, and leading to destruction of junction and melted wiring.

However, the electrostatic protection element 104 in FIG. 9 according to Embodiment 4 has, as seen in FIG. 10, the V-I characteristics showing that (i) the holding voltage Vh is higher than the power-supply voltage VDD, and (ii) the operation trigger voltage $V_{TRG}$ of the thyristor is lower than the voltage $V_{DES}$ which destructs the inside of the semiconductor integrated circuit. This successfully prevents the electrical overstress from destructing the inside of the semiconductor integrated circuit.

As described above, Embodiment 4 shows that a typical thyristor structure additionally has the fifth high-concentration diffusion region 6, and the sixth high-concentration diffusion region 7. The fifth high-concentration diffusion region 6 and the sixth high-concentration diffusion region 7 are electrically connected with each other, and the seventh high-concentration diffusion region 10, the third high-concentration diffusion region 9, and the fourth high-concentration diffusion region 8 are electrically connected with each other. This structure successfully prevents electrical overstress from destructing the inside of the semiconductor integrated circuit.

[Embodiment 5]

Figure 12:
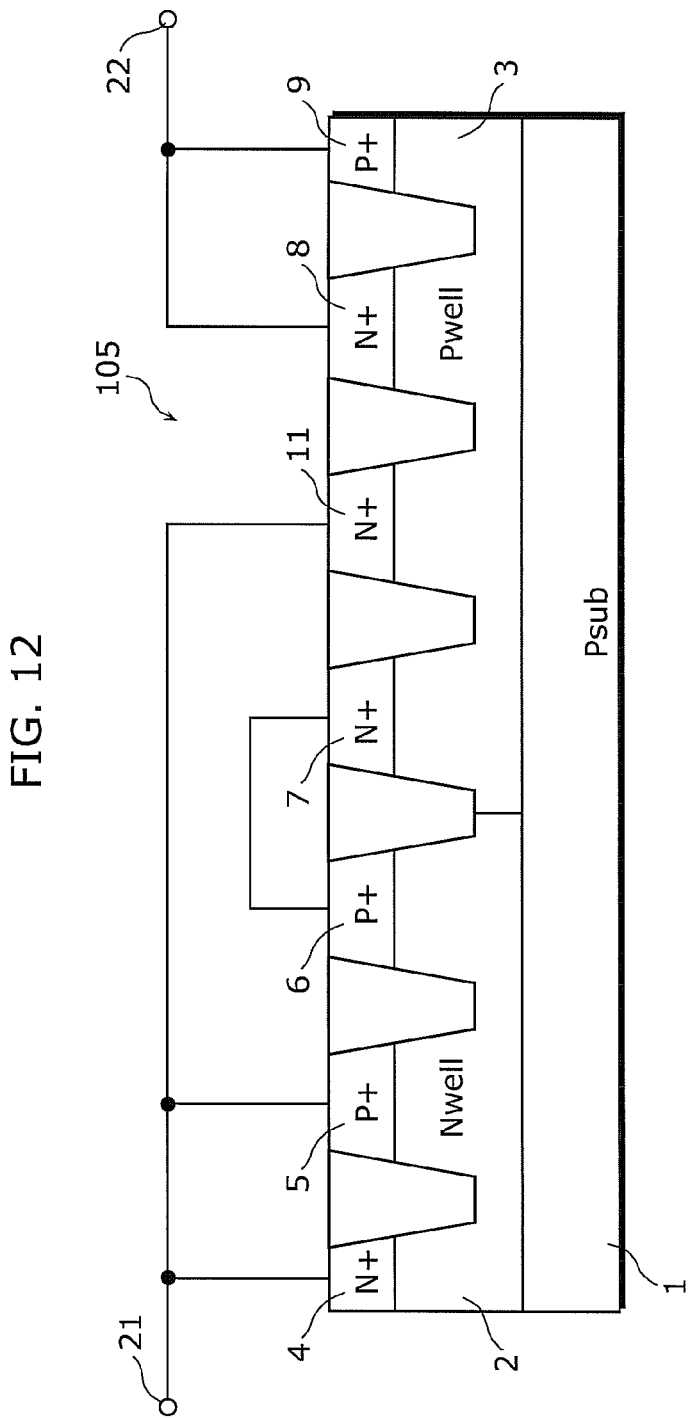
FIG. 12 is a structural diagram of an electrostatic protection element according to Embodiment 5 of the present invention.

FIG. 12 is a structural diagram of an electrostatic protection element equipped with a thyristor according to Embodiment 5 of the present invention.

The V-I characteristic graph of an electrostatic protection element 105 according to Embodiment 5 is the same as that of the electrostatic protection element 104 shown in FIG. 10.

Figure 13:
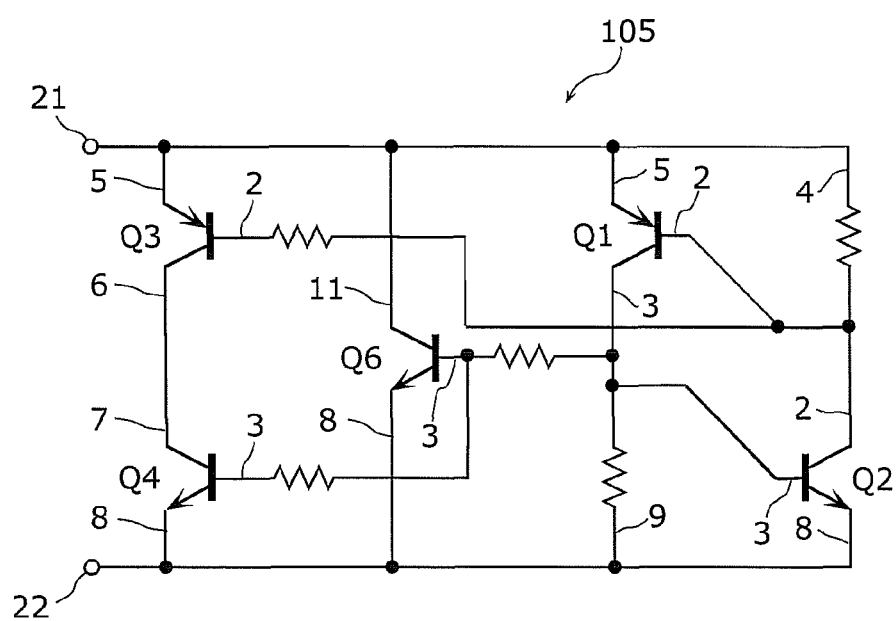
FIG. 13 is an equivalent circuit diagram of the electrostatic protection element according to Embodiment 5 of the present invention.

FIG. 13 is an equivalent circuit diagram of the electrostatic protection element 105 according to Embodiment 5.

It is noted that FIG. 13 shows a part of a parasitic element found in the structure in FIG. 12, as well as the PNP bipolar transistor Q1 and the NPN bipolar transistor Q2 forming the thyristor. For example, the PNP bipolar transistors Q3, and the NPN bipolar transistors Q4 and Q6 in FIG. 13 are a part of the parasitic element added to the structure shown in FIG. 12.

The parts sharing the same reference signs between FIGS. 12 and 13 correspond with each other. Such parts work as the base, the collector, and the emitter of each bipolar transistor.

As shown in FIG. 12, the electrostatic protection element 105 includes the seventh high-concentration diffusion region 11 of the second conductivity type formed in the second low-concentration diffusion region 3, in addition to all the constituent features of the electrostatic protection element 101 shown in FIG. 1. The seventh high-concentration diffusion region 11, the first high-concentration diffusion region 4, and the second high-concentration diffusion region 5 are electrically connected with each other.

Described hereinafter are operations of the electrostatic protection element 105 structured above according to Embodiment 5.

As shown in FIG. 26, the thyristor with its structure shown in FIG. 25 has (i) the holding voltage Vh lower than the power-supply voltage VDD, and (ii) the operation trigger voltage $V_{TRG}$ thereof higher than the voltage $V_{DES}$ which destructs the inside of the semiconductor integrated circuit. Thus the use of the thyristor as an electrostatic protection element causes either (i) the destruction of the inside of the semiconductor integrated circuit by electrical overstress or (ii) the latchup in the thyristor itself; namely the electrostatic protection element, followed by the overcurrent developing Joule heat, and leading to destruction of junction and melted wiring.

However, the electrostatic protection element 105 in FIG. 12 according to Embodiment 5 has, as seen in FIG. 10, the V-I characteristics showing that (i) the holding voltage Vh is higher than the power-supply voltage VDD, and (ii) the operation trigger voltage $V_{TRG}$ of the thyristor is lower than the voltage $V_{DES}$ which destructs the inside of the semiconductor integrated circuit. This successfully prevents development of the latchup and destruction of the inside of the semiconductor integrated circuit caused by electrical overstress.

As described above, Embodiment 5 shows that a typical thyristor structure additionally has the fifth high-concentration diffusion region 6, the sixth high-concentration diffusion region 7, and the seventh high-concentration diffusion region 11. The fifth high-concentration diffusion region 6 and the sixth high-concentration diffusion region 7 are electrically connected with each other, and the seventh high-concentration diffusion region 11, the first high-concentration diffusion region 4, and the second high-concentration diffusion region 5 are electrically connected with each other. This structure successfully prevents development of the latchup and destruction of the inside of the semiconductor integrated circuit caused by electrical overstress.

[Embodiment 6]

Figure 14:
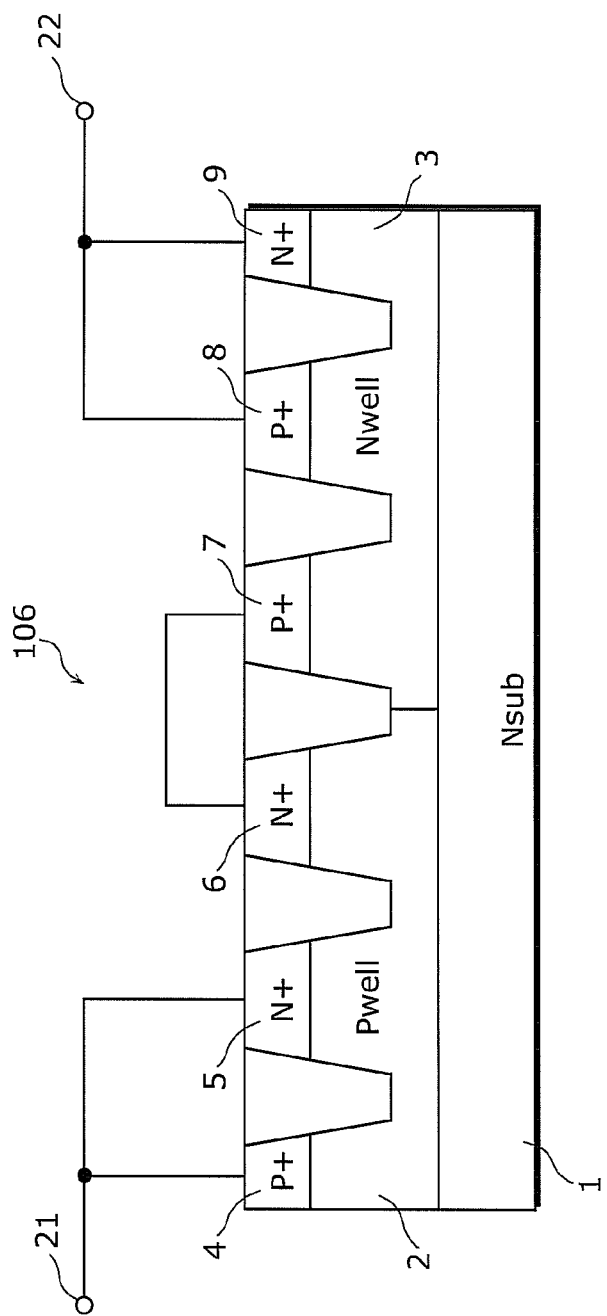
FIG. 14 is a structural diagram of an electrostatic protection element according to Embodiment 6 of the present invention.

FIG. 14 is a structural diagram of an electrostatic protection element 106 equipped with a thyristor according to Embodiment 6 of the present invention.

The V-I characteristic graph of the electrostatic protection element 106 according to Embodiment 6 is the same as that of the electrostatic protection element 101 shown in FIG. 2.

Figure 15:
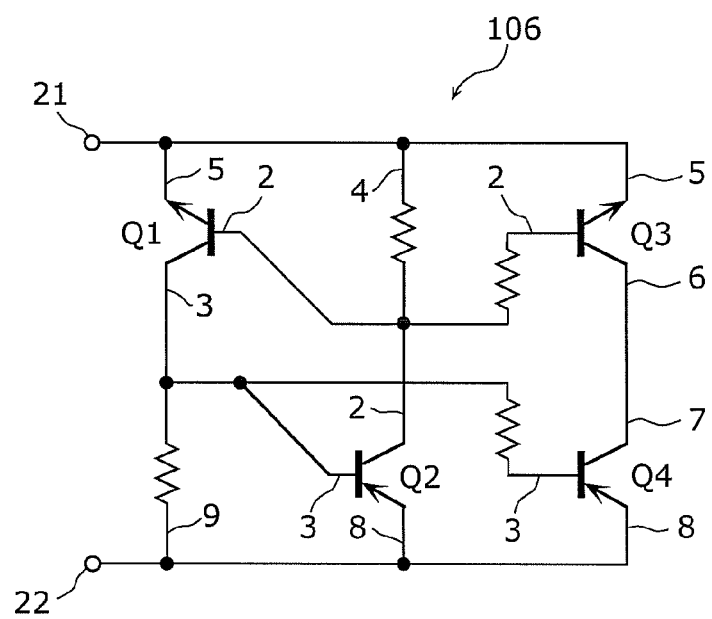
FIG. 15 is an equivalent circuit diagram of the electrostatic protection element according to Embodiment 6 of the present invention.

FIG. 15 is an equivalent circuit diagram of the electrostatic protection element 106 according to Embodiment 6.

It is noted that the electrostatic protection element 106 in FIG. 14 is the electrostatic protection element 101 according to Embodiment 1 having the first conductivity type interchanged with the second conductivity type. It is noted that FIG. 15 shows a part of a parasitic element found in the structure in FIG. 14, as well as an NPN bipolar transistor Q1 and a PNP bipolar transistor Q2 forming the thyristor. For example, an NPN bipolar transistor Q3 and a PNP bipolar transistor Q4 in FIG. 15 are a part of the parasitic element added to the structure of FIG. 14.

The parts sharing the same reference signs between FIGS. 14 and 15 correspond with each other. Such parts work as the base, the collector, and the emitter of each bipolar transistor.

The electrostatic protection element 106 in FIG. 14 and the electrostatic protection element 101 in FIG. 1 are the same in structure. The difference between the electrostatic protection element 106 and the electrostatic protection element 101 is that, in the electrostatic protection element 106, the first conductivity type and the second conductivity type are the n-type and the p-type, respectively.

The substrate 1 of the first conductivity type corresponds to Nsub. The first low-concentration diffusion region 2 of the second conductivity type corresponds to Pwell. The second low-concentration diffusion region 3 of the first conductivity type corresponds to Nwell. External terminals 21 and 22 of the electrostatic protection element 106 are respectively connected to a low potential (the ground potential GND, for example) and to a high potential (the power-supply voltage VDD, for example).

The electrostatic protection element 106 structured above according to Embodiment 6 operates similarly as the electrostatic protection element 101 according to Embodiment 1 does. As the V-I characteristics in FIG. 2 shows, the holding voltage Vh is higher than the power-supply voltage VDD, and the electrostatic protection element 106 successfully prevents the latchup.

As described above, Embodiment 6 shows that a typical thyristor structure additionally has the fifth high-concentration diffusion region 6 and the sixth high-concentration diffusion region 7 which are electrically connected with each other. This structure successfully prevents the latchup. Hence the electrostatic protection element 106, which is the electrostatic protection element 101 according to Embodiment 1 having the first conductivity type interchanged with the second conductivity type, successfully achieves an effect similar to that of the electrostatic protection element 101.

It is noted that, based on a similar idea to the above one, the first conductivity type may be interchanged with the second conductivity type in the electrostatic protection elements 102 to 105 according to Embodiments 2 to 5. The details thereof shall be omitted. An electrostatic protection element, having (i) the same structure as those of the electrostatic protection elements 102 to 105 and (ii) the n-type for the first conductivity type and the p-type for the second conductivity type, can obtain an effect similar to those of the electrostatic protection elements 102 to 105.

[Embodiment 7]

Figure 16:
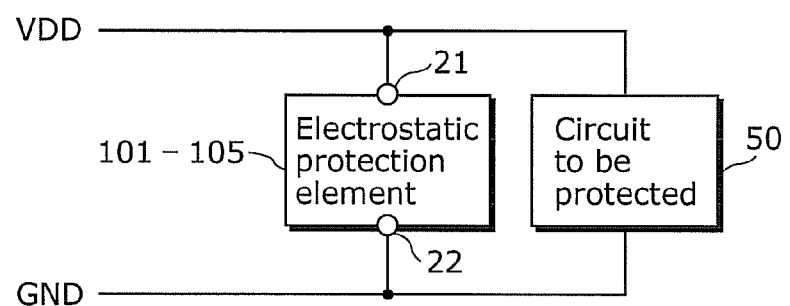
FIG. 16 is a schematic view of an electrostatic protection element according to Embodiment 7 of the present invention.

FIG. 16 is a schematic view showing a usage example of an electrostatic protection element according to Embodiment 7 of the present invention.

In FIG. 16, as an example, each of the electrostatic protection elements 101 to 105 according to Embodiments 1 to 5 is connected in parallel to a circuit to be protected 50. The external terminals 21 and 22 of each of the electrostatic protection elements 101 to 105 are respectively connected to a high potential (VDD) and to a low potential (GND).

The usage example of the above-structured electrostatic protection element according to Embodiment 7 is suitable for the electrostatic protection elements 101 to 105 according to Embodiments 1 to 5 having the p-type for the first conductivity type and the n-type for the second conductivity type. For example, the electrostatic protection element can protect the circuit to be protected 50 against a surge in the power line.

It is noted that the usage example according to Embodiment 7 shows that the external terminals 21 and 22 of the electrostatic protection elements 101 to 105 are respectively connected to VDD and GND; however, such a usage example shall not limit the connections of the external terminals 21 and 22. For example, the external terminal 21 may be connected to the I/O terminal of the circuit to be protected 50. In such a case, the circuit to be protected 50 is successfully protected against, for example, a surge applied to the I/O terminal.

[Embodiment 8]

Figure 17:
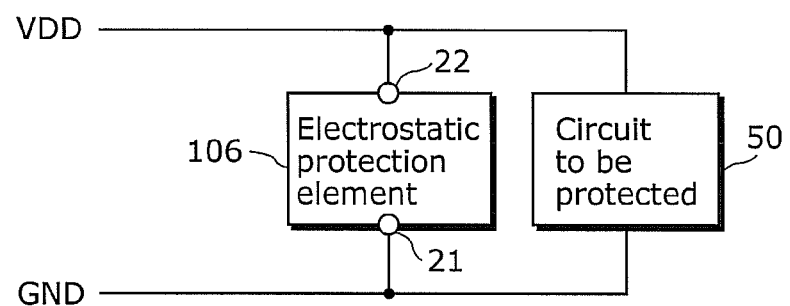
FIG. 17 is a schematic view of an electrostatic protection element according to Embodiment 8 of the present invention.

FIG. 17 is a schematic view showing a usage example of an electrostatic protection element according to Embodiment 8 of the present invention.

In FIG. 17, as an example, the electrostatic protection element 106 according to Embodiment 6 is connected in parallel to the circuit to be protected 50. The external terminals 21 and 22 of the electrostatic protection element 106 are respectively connected to a low potential (GND) and to a high potential (VDD).

The usage example of the above-structured electrostatic protection element according to Embodiment 8 is suitable for the electrostatic protection element 106 according to Embodiment 6 having the n-type for the first conductivity type and the p-type for the second conductivity type. For example, the electrostatic protection element can protect the circuit to be protected 50 from a surge in the power line.

It is noted that the usage example according to Embodiment 8 shows that the external terminals 21 and 22 in FIG. 17 are respectively connected to GND and VDD; however, such a usage example shall not limit the connections of the external terminals 21 and 22. For example, the external terminal 22 may be connected to the I/O terminal of the circuit to be protected 50. In such a case, the circuit to be protected 50 is successfully protected against, for example, a surge applied to the I/O terminal.

[Embodiment 9]

Figure 18:
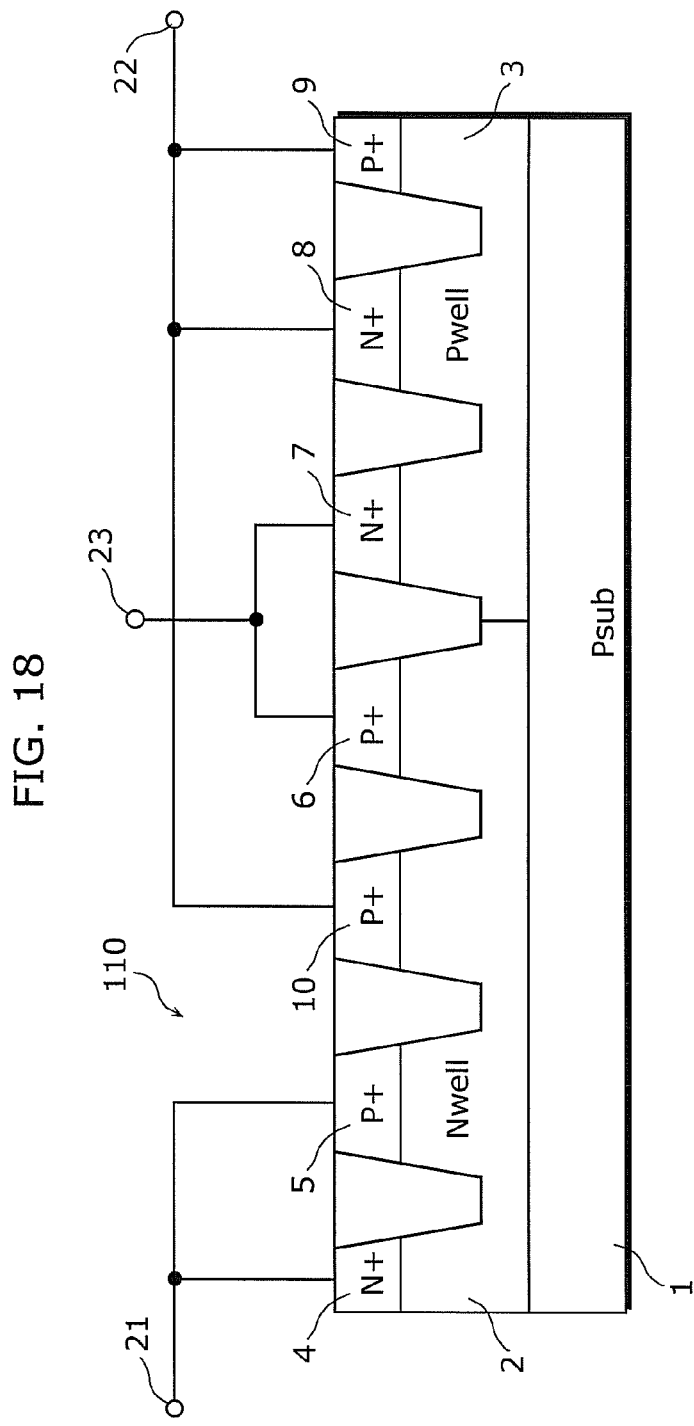
FIG. 18 is a structural diagram of an electrostatic protection element according to Embodiment 9 of the present invention.

FIG. 18 is a structural diagram of an electrostatic protection element 110 equipped with a thyristor according to Embodiment 9 of the present invention.

Figure 19:
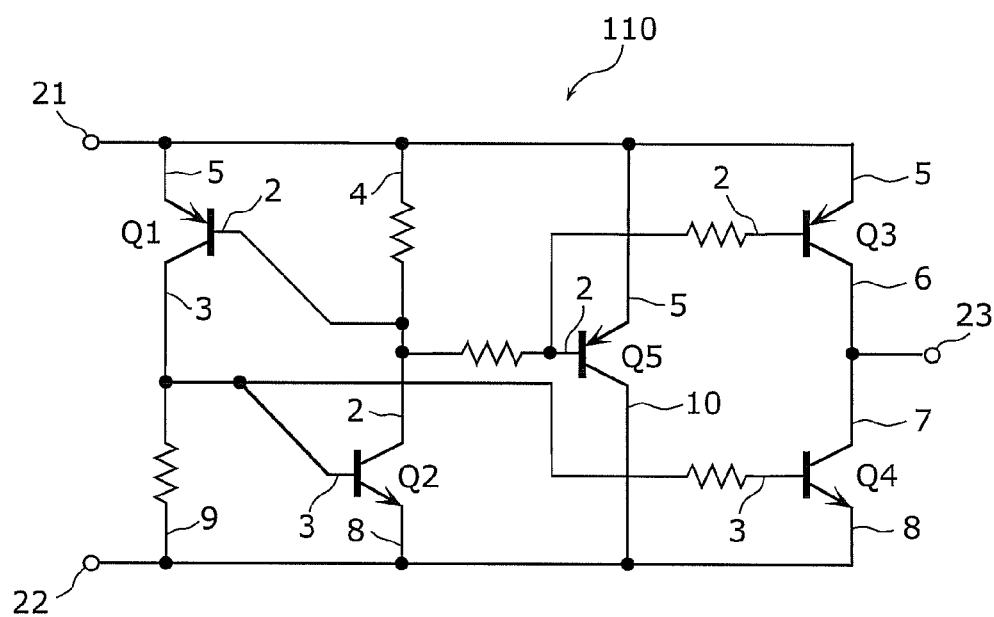
FIG. 19 is an equivalent circuit diagram of the electrostatic protection element according to Embodiment 9 of the present invention.

FIG. 19 is an equivalent circuit diagram of the electrostatic protection element 110 according to Embodiment 9.

It is noted that the electrostatic protection element 110 in FIG. 18 is structured based on the electrostatic protection element 104 according to Embodiment 4. FIG. 19 shows a part of a parasitic element found in the structure in FIG. 18, as well as the PNP bipolar transistor Q1 and the NPN bipolar transistor Q2 forming the thyristor. For example, the PNP bipolar transistors Q3 and Q5, and the NPN bipolar transistor Q4 in FIG. 19 are a part of the parasitic element added to the structure shown in FIG. 18.

The parts sharing the same reference signs between FIGS. 18 and 19 correspond with each other. Such parts work as the base, the collector, and the emitter of each bipolar transistor.

As shown in FIG. 18, the electrostatic protection element 110 includes an external terminal 23 electrically connected to a connection point between the fifth high-concentration diffusion region 6 and the sixth high-concentration diffusion region 7, in addition to all the constituent features of the electrostatic protection element 104 shown in FIG. 9. This structure makes possible externally controlling the potentials of fifth high-concentration diffusion region 6 and the sixth high-concentration diffusion region 7.

Described hereinafter are operations of the electrostatic protection element 110 structured above according to Embodiment 9.

As shown in FIG. 26, the thyristor with its structure shown in FIG. 25 has (i) the holding voltage Vh lower than the power-supply voltage VDD, and (ii) the operation trigger voltage $V_{TRG}$ of the thyristor higher than the voltage $V_{DES}$ which destructs the inside of the semiconductor integrated circuit. Thus the use of the thyristor as an electrostatic protection element causes either (i) the destruction of the inside of the semiconductor integrated circuit by electrical overstress or (ii) the latchup in the thyristor; namely the electrostatic protection element, followed by the overcurrent developing Joule heat, and leading to destruction of junction and melted wiring.

In the case of the electrostatic protection element 110 according to Embodiment 9 shown in FIG. 18, however, the application of a desired voltage to the external terminal 23 (i) makes possible controlling the holding voltage Vh using any given voltage, and (ii) makes the operation trigger voltage $V_{TRG}$ of the thyristor lower than the voltage $V_{DES}$ which destructs the inside of the semiconductor integrated circuit. This successfully controls any given latchup-developing potential with respect to the power-supply voltage, and prevents the electrical overstress from destructing the inside of the semiconductor integrated circuit.

[Embodiment 10]

Figure 20:
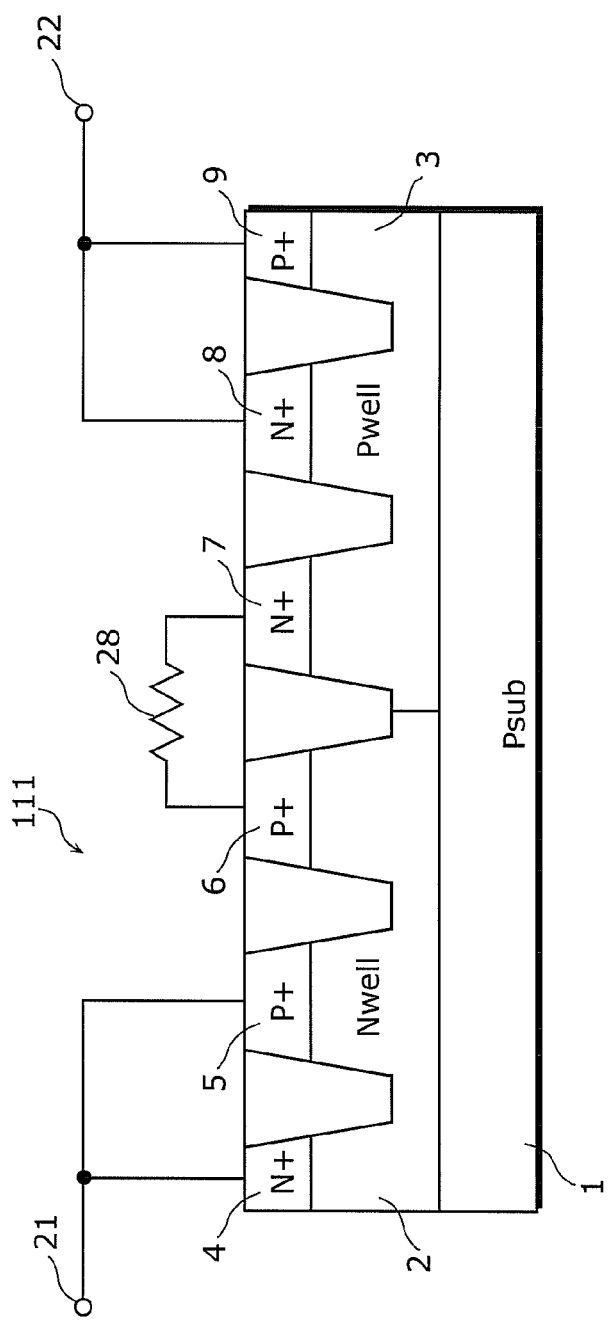
FIG. 20 is a structural diagram of an electrostatic protection element according to Embodiment 10 of the present invention.

FIG. 20 is a structural diagram of an electrostatic protection element 111 according to Embodiment 10 of the present invention.

Figure 21:
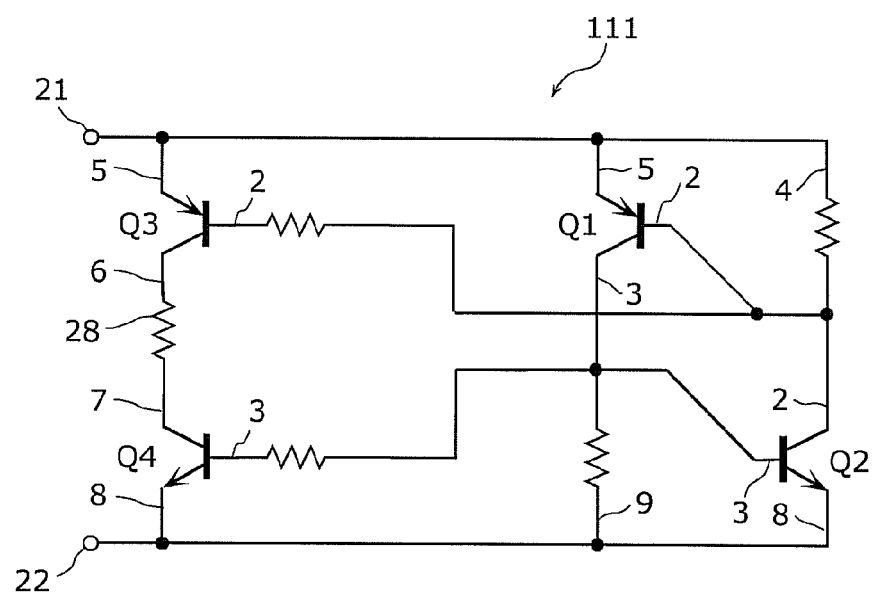
FIG. 21 is an equivalent circuit diagram of the electrostatic protection element according to Embodiment 10 of the present invention.

FIG. 21 is an equivalent circuit diagram of the electrostatic protection element 111 according to Embodiment 10.

It is noted that the electrostatic protection element 111 in FIG. 20 is structured based on the electrostatic protection element 101 according to Embodiment 1. FIG. 21 shows a part of a parasitic element found in the structure in FIG. 20, as well as the PNP bipolar transistor Q1 and the NPN bipolar transistor Q2 forming the thyristor. For example, the PNP bipolar transistors Q3 and the NPN bipolar transistors Q4 in FIG. 21 are a part of the parasitic element added to the structure shown in FIG. 20.

The parts sharing the same reference signs between FIGS. 20 and 21 correspond with each other. Such parts work as the base, the collector, and the emitter of each bipolar transistor.

As shown in FIG. 20, the electrostatic protection element 111 includes a resistive element 28 electrically connecting the fifth high-concentration diffusion region 6 and the sixth high-concentration diffusion region 7 with each other, in addition to all the constituent features of the electrostatic protection element 101 shown in FIG. 1.

Described hereinafter are operations of the electrostatic protection element 111 structured above according to Embodiment 10.

As shown in FIG. 26, the thyristor with its structure shown in FIG. 25 has (i) the holding voltage Vh lower than the power-supply voltage VDD, and (ii) the operation trigger voltage $V_{TRG}$ of the thyristor higher than the voltage $V_{DES}$ which destructs the inside of the semiconductor integrated circuit. Thus the use of the thyristor as an electrostatic protection element causes either (i) the destruction of the inside of the semiconductor integrated circuit by electrical overstress or (ii) the latchup in the thyristor; namely the electrostatic protection element, followed by the overcurrent developing Joule heat, and leading to destruction of junction and melted wiring.

In the case of the electrostatic protection element 111 according to Embodiment 10 shown in FIG. 20, however, the resistive element 28 having a desired value of resistance electrically connects the fifth high-concentration diffusion region 6 and the sixth high-concentration diffusion region 7 with each other. Such an electrical connection (i) makes possible controlling the holding voltage Vh using the value of resistance across the resistive element 28, and (ii) makes the operation trigger voltage $V_{TRG}$ of the thyristor lower than the voltage $V_{DES}$ which destructs the inside of the semiconductor integrated circuit. This successfully controls any given latchup-developing potential with respect to the power-supply voltage, and prevents the electrical overstress from destructing the inside of the semiconductor integrated circuit.

It is noted that the element structure of the resistive element 28 shall not be limited as far as the element is resistive. For example, the resistive element 28 is formed of a diffused resistor, polysilicon resistor, a silicide resistor, a contact/via resistor, and a well resistor.

[Embodiment 11]

Figure 22:
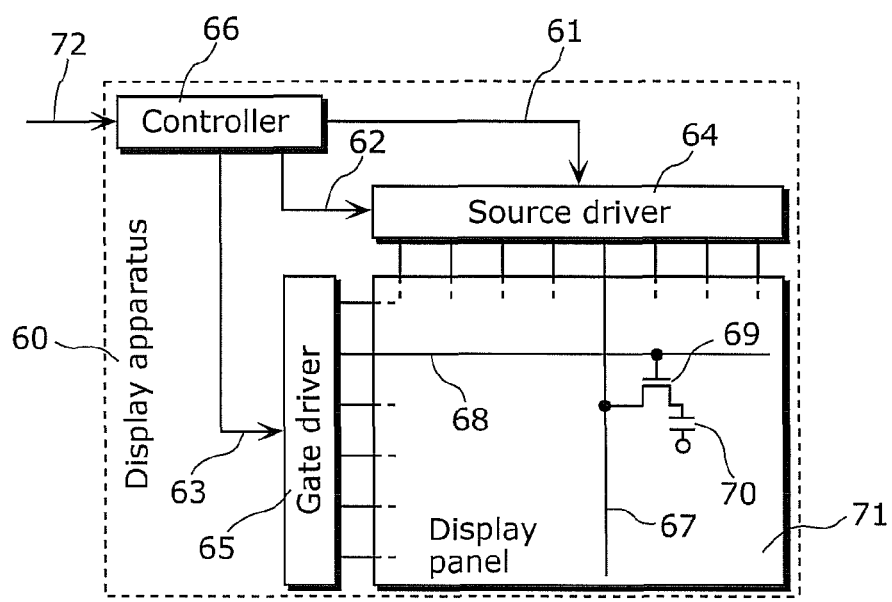
FIG. 22 is a schematic view of a display apparatus according to Embodiment 11 of the present invention.

FIG. 22 is a schematic view of a display apparatus 60 according to Embodiment 11 of the present invention.

It is noted that FIG. 22 shows a structure of a typical liquid crystal display apparatus. Obviously, Embodiment 11 shall not be limited by the type of the display device.

FIG. 22 shows typical operations of the display apparatus 60.

A display panel 71 has a TFT 69 on a point at the intersection of a signal line 67 with a scanning line 68. The TFT 69 has the gate connected to the scanning line 68, the drain connected to the signal line 67, and the source connected to an electrode of a liquid crystal capacitor 70 forming a liquid crystal display. The electrode opposite the liquid crystal capacitor 70 is a transparent electrode. A predetermined voltage is written via the signal line 67 to the liquid crystal capacitor 70 connected to the TFT 69 in order to change the orientation of the liquid crystal changes, so that an image is obtained. Here the TFT 69 becomes open circuit when the scanning line 68 goes high.

In addition, a gate driver 65 and a source driver 64 are respectively provided at ends of the scanning line 68 and the signal line 67 of the display panel 71. The source driver 64 and the gate driver 65 are controlled by a controller 66. The controller 66 generates a video signal 61 and a control signal 62 out of a signal 72. The control signal 62 is used for driving a signal line. Provided from outside, the signal 72 includes a row synchronization signal, a column synchronization signal, and a video signal. Then, the controller 66 supplies the video signal 61 and the control signal 62 to the source driver 64. The source driver 64 generates a control signal 63 for driving a scanning line, and supplies the control signal 63 to the gate driver 65.

Here the source driver 64, the gate driver 65, and the controller 66 respectively exemplify a signal line driving circuit, a scanning line driving circuit, and a control circuit each of which is formed in a semiconductor integrated circuit.

The above-structured display apparatus 60 has the electrostatic protection elements according to Embodiments 1 to 9 implemented therein. Hence, the electrostatic protection elements successfully prevent the electrostatic discharge (ESD) and the electrical overstress (EOS) developed in the display apparatus 60 from destructing the semiconductor integrated circuit.

The positions of the electrostatic protection elements to be implemented in the display apparatus 60 shall not be limited in particular. For example, the electrostatic protection elements may be implemented as a part of a semiconductor integrated circuit in which any one of the source driver 64, the gate driver 65, and the controller 66 is formed.

[Embodiment 12]

Figure 23:
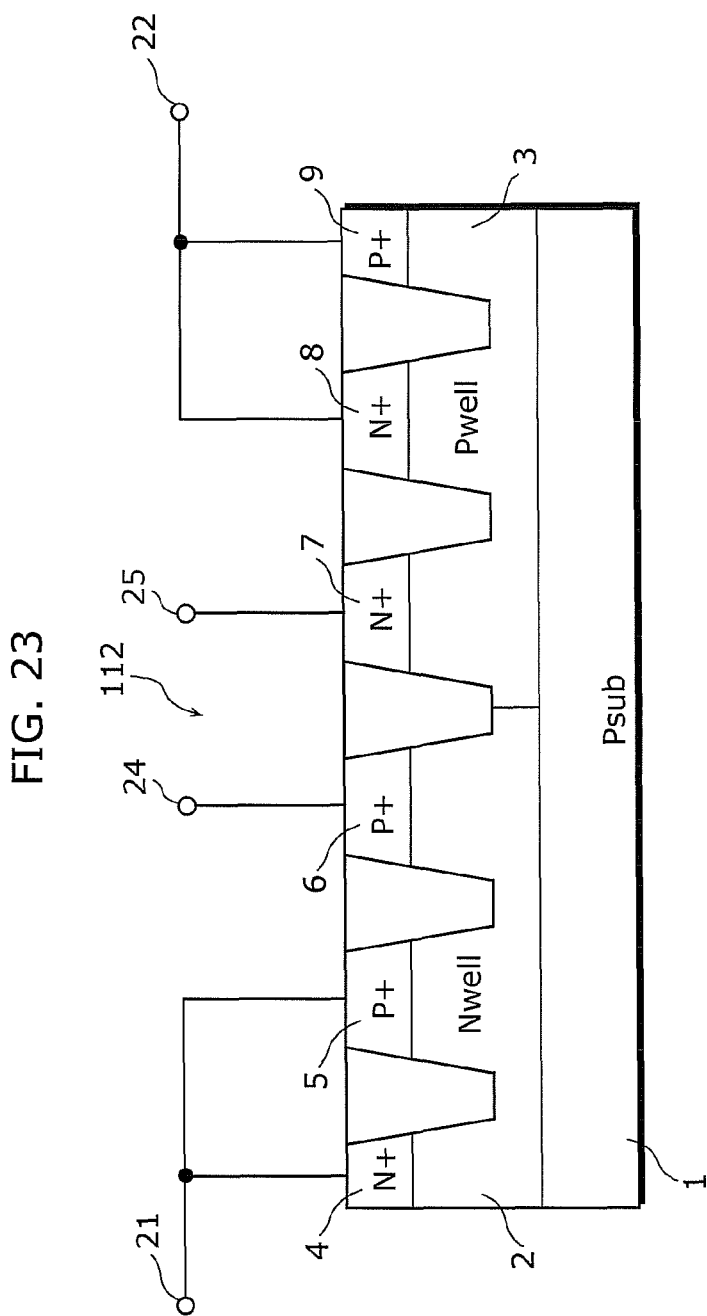
FIG. 23 is a structural diagram of an electrostatic protection element according to Embodiment 12 of the present invention.

FIG. 23 is a structural diagram of an electrostatic protection element 112 according to Embodiment 12 of the present invention.

Figure 24:
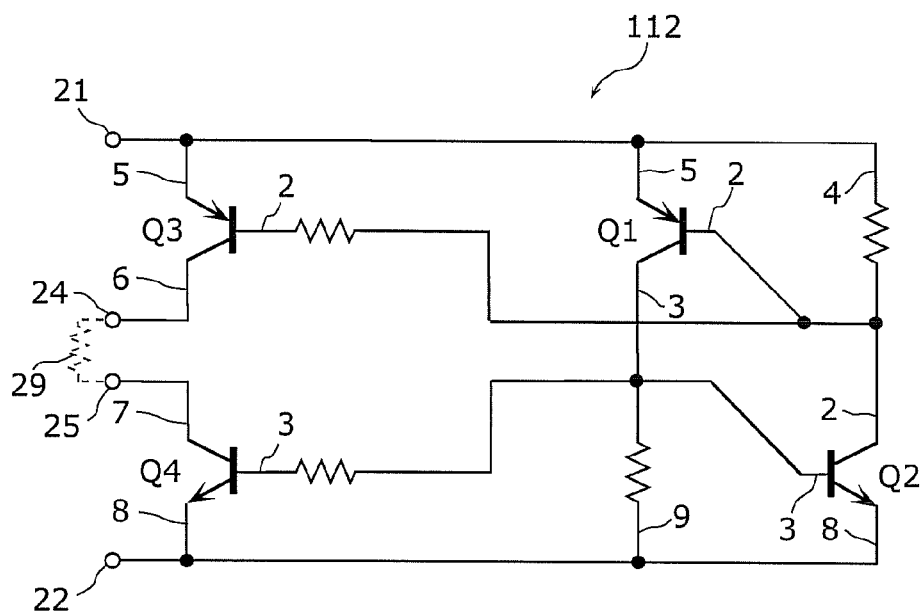
FIG. 24 is an equivalent circuit diagram of the electrostatic protection element according to Embodiment 12 of the present invention.

FIG. 24 is an equivalent circuit diagram of the electrostatic protection element 112 according to Embodiment 12.

In FIG. 23, the electrostatic protection element 112 is assumed to be implemented in the display apparatus 60, as described in Embodiment 11, and is structured based on the electrostatic protection element 111 according to Embodiment 10 in FIG. 20. FIG. 24 shows a part of a parasitic element found in the structure in FIG. 23, as well as the PNP bipolar transistor Q1 and the NPN bipolar transistor Q2 forming the thyristor. For example, the PNP bipolar transistors Q3 and the NPN bipolar transistor Q4 in FIG. 24 are a part of the parasitic element added to the structure shown in FIG. 23.

The parts sharing the same reference signs between FIGS. 23 and 24 correspond with each other. Such parts work as the base, the collector, and the emitter of each bipolar transistor.

In order to externally have a resistive element for controlling the holding voltage Vh of the thyristor, the electrostatic protection element 112 in FIG. 23 includes external terminals 24 and 25 for connecting an external resistive element 29, instead of the resistive element 28 of the electrostatic protection element 111 in FIG. 20. The external terminals 24 and 25 are respectively connected to the fifth high-concentration diffusion region 6 and the sixth high-concentration diffusion region 7, and are connected with each other via an external resistor 29 in FIG. 24. For example, the external resistor 29 is provided in the display apparatus 60.

Described hereinafter are operations of the electrostatic protection element 112 structured above according to Embodiment 12.

As shown in FIG. 26, the thyristor with its structure shown in FIG. 25 has (i) the holding voltage Vh lower than the power-supply voltage VDD, and (ii) the operation trigger voltage $V_{TRG}$ of the thyristor higher than the voltage $V_{DES}$ which destructs the inside of the semiconductor integrated circuit. Thus the use of the thyristor as an electrostatic protection element causes either (i) the destruction of the inside of the semiconductor integrated circuit by electrical overstress or (ii) the latchup in the thyristor; namely the electrostatic protection element, followed by the overcurrent developing Joule heat, and leading to destruction of junction and melted wiring.

In the case of the electrostatic protection element 112 according to Embodiment 12 in FIG. 23, however, the external resistive element with a desired resistance value is implemented in the display apparatus 60 and connected to the external terminals 24 and 25. This structure (i) makes possible controlling the holding voltage Vh using any given voltage, and (ii) makes the operation trigger voltage $V_{TRG}$ of the thyristor lower than the voltage $V_{DES}$ which destructs the inside of the semiconductor integrated circuit. This successfully controls any given latchup-developing potential with respect to the power-supply voltage, and prevents the electrical overstress from destructing the inside of the semiconductor integrated circuit.

It is noted that the element structure of the external resistive element implemented in the display apparatus 60 of FIG. 22 shall not be limited as far as the element is resistive. For example, the external resistive element is formed of a diffused resistor, polysilicon resistor, a silicide resistor, a contact/via resistor, a well resistor, a metal-film resistor, and a carbon-film resistor.

Although only some exemplary embodiments of this invention have been described in detail above, those skilled in the art will readily appreciate that many modifications are possible in the exemplary embodiments without materially departing from the novel teachings and advantages of this invention. Accordingly, all such modifications are intended to be included within the scope of this invention.

[Industrial Applicability]

An electrostatic protection element of the present invention is capable of preventing latchup and destruction of the inside of a semiconductor integrated circuit. In particular, the electrostatic protection element is useful as an electrostatic protection element for the semiconductor integrated circuit.

REFERENCE SIGNS LIST

1 Substrate
2 First low-concentration diffusion region
3 Second low-concentration diffusion region
4 First high-concentration diffusion region
5 Second high-concentration diffusion region
6 Fifth high-concentration diffusion region
7 Sixth high-concentration diffusion region
8 Fourth high-concentration diffusion region
9 Third high-concentration diffusion region
10 and 11 Seventh high-concentration diffusion region
21 to 25 External terminal
28 Resistive element
29 External resistive element
50 Circuit to be protected
60 Display apparatus
61 Video signal
62 and 63 Control signal
64 Source driver
65 Gate driver
66 Controller
67 Signal line
68 Scanning line
69 TFT
70 Liquid crystal capacitor
71 Display panel
72 Signal
101 to 106, 110 to 112 Electrostatic protection element
Q1 to Q6 Bipolar transistor

The invention claimed is:

1. An electrostatic protection element comprising:
a substrate of a first conductivity type;
a first low-concentration diffusion region of a second conductivity type and a second low-concentration diffusion region of the first conductivity type which are formed on said substrate, the second conductivity type being different from the first conductivity type; a first high-concentration diffusion region of the second conductivity type and a second high-concentration diffusion region of the first conductivity type which are (i) formed in said first low-concentration diffusion region, and (ii) electrically connected with each other;
a third high-concentration diffusion region of the first conductivity type and a fourth high-concentration diffusion region of the second conductivity type which are (i) formed in said second low-concentration diffusion region, and (ii) electrically connected with each other;
a fifth high-concentration diffusion region of the first conductivity type formed in said first low-concentration diffusion region;
a sixth high-concentration diffusion region of the second conductivity type formed in said second low-concentration diffusion region; and a seventh high-concentration diffusion region which (i) is formed in one of said first low-concentration diffusion region and said second low-concentration diffusion region, and (ii) has a conductivity type different from the conductivity type of one of said first low-concentration diffusion region and said second low-concentration diffusion region in which said seventh high-concentration diffusion region is formed, wherein said seventh high-concentration diffusion region is electrically connected with one of said second high-concentration diffusion region and said fourth high-concentration diffusion region whichever having the conductivity type different from the conductivity type of said seventh high-concentration diffusion region.

2. The electrostatic protection element according to claim 1,
wherein the first conductivity type is a p-type, and the second conductivity type is an n-type,
said first high-concentration diffusion region and said second high-concentration diffusion region are connected to a high potential, and
said third high-concentration diffusion region and said fourth high-concentration diffusion region are connected to a low potential.

3. The electrostatic protection element according to claim 1,
wherein the first conductivity type is an n-type, and the second conductivity type is a p-type,
said first high-concentration diffusion region and said second high-concentration diffusion region are connected to a low potential, and
said third high-concentration diffusion region and said fourth high-concentration diffusion region are connected to a high potential.

4. The electrostatic protection element according to claim 1,
wherein said fifth high-concentration diffusion region and said sixth high-concentration diffusion region are electrically connected with each other.

5. The electrostatic protection element according to claim 4, further comprising
an external terminal which is electrically connected to a connection point between said fifth high-concentration diffusion region and said sixth high-concentration diffusion region.

6. The electrostatic protection element according to claim 4,
wherein said fifth high-concentration diffusion region and said sixth high-concentration diffusion region are electrically connected with each other via a resistive element.

7. A display apparatus comprising:
a control circuit which controls a signal line and a scanning line based on one or more signals provided from outside;
a signal line driving circuit;
a scanning line driving circuit; and
said one or more electrostatic protection elements according to claim 4.

8. The display apparatus according to claim 7,
wherein said one or more electrostatic protection elements are implemented in one or more of said control circuit, said signal line driving unit, and said scanning line driving circuit.

9. The electrostatic protection element according to claim 1, further comprising:
an external terminal which is electrically connected to said fifth high-concentration diffusion region; and
an external terminal which is electrically connected to said sixth high-concentration diffusion region.

10. A display apparatus comprising:
a control circuit which controls a signal line and a scanning line based on one or more signals provided from outside;
a signal line driving circuit;
a scanning line driving circuit; and
said one or more electrostatic protection elements according to claim 9,
wherein said one or more electrostatic protection elements are implemented in one or more of said control circuit, said signal line driving unit, and said scanning unit, and
said two external terminals of said electrostatic protection element are connected with each other via one or more resistive elements provided to said display apparatus.

* * * * *